US012799588B2

(12) United States Patent
Deye et al.

(10) Patent No.: US 12,799,588 B2
(45) Date of Patent: Nov. 17, 2026

(54) SYSTEMS AND METHODS FOR REMOVING COLLATERAL DEPOSITIONS FROM WITHIN CHAMBER ARRANGEMENTS IN SEMICONDUCTOR PROCESSING SYSTEMS

(71) Applicant: ASM IP Holding B.V., Almere (NL)

(72) Inventors: Gregory Deye, Seattle, WA (US); Mohamed Ebaid Abdrabou Hussein, Glibert, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/815,445

(22) Filed: Aug. 26, 2024

(65) Prior Publication Data

US 2025/0075317 A1 Mar. 6, 2025

Related U.S. Application Data

(60) Provisional application No. 63/535,433, filed on Aug. 30, 2023.

(51) Int. Cl.
*C23C 16/44* (2006.01)
*C23C 16/455* (2006.01)
*C23C 16/46* (2006.01)

(52) U.S. Cl.
CPC ...... *C23C 16/4405* (2013.01); *C23C 16/4404* (2013.01); *C23C 16/4408* (2013.01); *C23C 16/4412* (2013.01); *C23C 16/45512* (2013.01); *C23C 16/45557* (2013.01); *C23C 16/463* (2013.01)

(58) Field of Classification Search
CPC ............ C23C 16/4405; C23C 16/4404; C23C 16/4408; C23C 16/4412; C23C 16/45512; C23C 16/45557; C23C 16/463
See application file for complete search history.

(56) References Cited

U.S. PATENT DOCUMENTS 6,042,654 A * 3/2000 Comita ............... C23C 16/4405 134/21
6,749,717 B1 * 6/2004 Sandhu ............. H01J 37/32862 156/345.35
11,053,591 B2 7/2021 Ma
2003/0098039 A1 5/2003 Cheong
2006/0169669 A1 * 8/2006 Zojaji ............... H01L 21/02019 216/37
2021/0292902 A1 * 9/2021 Kajbafvala ............. C30B 25/10

* cited by examiner

*Primary Examiner* — Kelly M Gambetta
(74) *Attorney, Agent, or Firm* — Banner & Witcoff, Ltd.

(57) ABSTRACT

A material layer deposition method includes flowing a silicon-containing material layer precursor through a chamber body and forming a silicon-containing accretion within the chamber body. A chlorine ($Cl_2$) gas-containing fill is introduced into the chamber body, at least a portion of the silicon-containing accretion is removed using the chlorine ($Cl_2$) gas-containing fill, and the chlorine ($Cl_2$) gas-containing fill and a silicon-containing etchant product removed from the chamber body. Semiconductor processing systems and computer program products are also described.

16 Claims, 14 Drawing Sheets

SYSTEMS AND METHODS FOR REMOVING COLLATERAL DEPOSITIONS FROM WITHIN CHAMBER ARRANGEMENTS IN SEMICONDUCTOR PROCESSING SYSTEMS

CROSS-REFERENCE TO RELATED APPLICATION(S)

This Application claims the benefit of U.S. Provisional Application 63/535,433 filed on Aug. 30, 2023, the entire contents of which are incorporated herein by reference.

FIELD OF INVENTION

The present disclosure generally relates to depositing material layers onto substrates. More particularly, the present disclosure relates to removing silicon-containing accretions from within semiconductor processing systems formed during the deposition of material layer onto substrates supported within semiconductor processing systems.

BACKGROUND OF THE DISCLOSURE

Material layers are commonly deposited onto substrates during the fabrication of semiconductor devices, such as logic and memory semiconductor devices. Material layer deposition is generally accomplished by supporting the substrate within a reaction chamber, heating the substrate to a desired material layer deposition temperature, and exposing the substrate to a flow of one or more material layer precursors under environmental conditions selected to cause a material layer to deposit onto the substrate. Once the material layer develops a desired property or properties flow of the material layer precursor to the substrate ceases and substrate removed from the reaction to undergo further processing, as appropriate for the semiconductor device to be formed using material layer.

In some material layer deposition operations material layer deposition onto the substrate may be accompanied by the accretion of a collateral deposition within the reaction chamber. For example, a collateral deposition may accrete on interior structures within the reaction chamber such on a substrate support structure arranged within the reaction chamber and employed to support the substrate during deposition of the material layer onto the substrate. Collateral deposition may alternatively (or additionally) accrete on interior surfaces of the reaction chamber, such as on interior surfaces of the reaction chamber bounding the process environment containing the substrate. And collateral depositions may accrete within clearances defined between mechanical components within the reaction chamber, such as between the substrate support and structures employed to seat and unseat the substrate from the substrate support. Such collateral depositions can, in some material layer deposition operations, limit reliability of the reaction chamber employed for the material layer deposition operation.

Various countermeasures exist to limit the effect that collateral depositions may have upon reliable operation of reaction chambers employed for material layer deposition. For example, internal structures may be removed from the reaction chamber and collateral deposition removed using an ex-situ removal technique, such as by mechanical removal and/or immersion of the structure within an acid bath. The interior of the reaction chamber and internal structures may be cleaned using an in-situ removal technique, such as by flowing an etchant through the reaction chamber subsequent to removal of the substrate from the reaction chamber and prior to a sequential material layer deposition technique, such as by flowing hydrochloric acid through the reaction chamber to remove collateral depositions accreted within the reaction chamber during material layer deposition. While generally satisfactory for their intended purpose, ex-situ and in-situ cleaning techniques can increases cost of ownership and/or limit throughput of the reaction chamber employed for material layer deposition, typically in a way that is commensurate with the amount of hydrochloric acid employed and duration of the cleaning event.

Such systems and methods have generally been satisfactory for their intended purpose. However, there remains a need for improved material layer deposition methods, semiconductor processing systems, and computer program products employed to deposit material layers onto substrates. The present disclosure provides a solution to this need.

SUMMARY OF THE DISCLOSURE

A material layer deposition method is provided. A material layer deposition method includes flowing a silicon-containing material layer precursor through a chamber body and forming a silicon-containing accretion within the chamber body. A chlorine ($Cl_2$) gas-containing fill is introduced into the chamber body, at least a portion of the silicon-containing accretion is removed using the chlorine ($Cl_2$) gas-containing fill, and the chlorine ($Cl_2$) gas-containing fill and a silicon-containing etchant product removed from the chamber body.

In addition to one or more of the features described above, or as an alternative, further examples of the method may include supporting a substrate within the chamber body prior to flowing the silicon-containing material layer precursor through the chamber body, exposing the substrate to the silicon-containing precursor during the flowing of the silicon-containing material layer precursor through the chamber body, depositing a silicon-containing material layer onto the substrate using the silicon-containing material layer precursor; and removing the substrate from the chamber body prior to introducing the chlorine ($Cl_2$) gas-containing fill into the chamber body.

In addition to one or more of the features described above, or as an alternative, further examples of the method may include intermixing hydrogen ($H_2$) gas with the silicon-containing material layer precursor prior to flowing the silicon-containing material layer precursor through the chamber body. Flowing the silicon-containing material layer precursor through the chamber body may include flowing the silicon-containing material layer precursor intermixed with the hydrogen ($H_2$) gas through the chamber body.

In addition to one or more of the features described above, or as an alternative, further examples of the method may include that pressure within the chamber body increases from about 5 Torr to about 100 Torr during introduction of the chlorine ($Cl_2$) gas-containing fill.

In addition to one or more of the features described above, or as an alternative, further examples of the method may include that forming the silicon-containing accretion includes forming the silicon-containing accretion on a quartz surface within the chamber body. Etching at least a portion of the silicon-containing accretion may include removing the silicon-containing accretion at least in part from the quartz surface within the chamber body.

In addition to one or more of the features described above, or as an alternative, further examples of the method may include forming the silicon-containing accretion includes forming the silicon-containing accretion on an exposed silicon carbide surface within the chamber body. Etching at least a portion of the silicon-containing accretion may include removing the silicon-containing accretion at least in part from the silicon carbide surface within the chamber body.

In addition to one or more of the features described above, or as an alternative, further examples of the method may include that introducing the chlorine ($Cl_2$) gas-containing fill into the chamber body may include flowing nitrogen ($N_2$) gas through an interior of the chamber body, purging an interior of the chamber body with the nitrogen ($N_2$) gas, fluidly separating an interior of the chamber body from an exhaust source, and introducing the chlorine ($Cl_2$) gas-containing fill into the interior of the chamber body while the chamber body is fluidly separated from the exhaust source.

In addition to one or more of the features described above, or as an alternative, further examples of the method may include that introducing the chlorine ($Cl_2$) gas-containing fill into the chamber body includes increasing pressure within the interior of the chamber body from a first pressure at a start of introducing the chlorine ($Cl_2$) gas-containing fill to a second pressure at a conclusion of introducing the chlorine ($Cl_2$) gas-containing fill.

In addition to one or more of the features described above, or as an alternative, further examples of the method may include that flowing the silicon-containing material layer precursor through the chamber body includes flowing the silicon-containing material layer precursor through an interior of the chamber body using a laminar flow pattern. Introducing the chlorine ($Cl_2$) gas-containing fill into the chamber body may include circulating the chlorine ($Cl_2$) gas-containing fill within the chamber body using a turbulent flow pattern.

In addition to one or more of the features described above, or as an alternative, further examples of the method may include rotating a substrate support arranged within the chamber body during etching at least a portion of the silicon-containing accretion with the chlorine ($Cl_2$) gas-containing fill. No substrate may be seated on the substrate support during rotation of the substrate support within the chamber body.

In addition to one or more of the features described above, or as an alternative, further examples of the method may include decreasing temperature of the chamber body while introducing the chlorine ($Cl_2$) gas-containing fill into the chamber body and etching at least a portion of the silicon-containing accretion using the chlorine ($Cl_2$) gas-containing fill, and decreasing temperature of a substrate support arranged within the chamber body while introducing the chlorine ($Cl_2$) gas-containing fill into the chamber body and etching at least a portion of the silicon-containing accretion using the chlorine ($Cl_2$) gas-containing fill.

In addition to one or more of the features described above, or as an alternative, further examples of the method may include that the silicon-containing accretion is resident upon an interior surface of an upper wall of the chamber body. Temperature of the chamber body (e.g., a transparent material forming the chamber body) may be decreased more slowly than the temperature of the substrate support to limit etching of a silicon carbide coating of the substrate support by the chlorine ($Cl_2$) gas-containing fill during etching of the silicon-containing accretion.

In addition to one or more of the features described above, or as an alternative, further examples of the method may include maintaining a temperature difference of between about 140 degrees Celsius and about 175 degrees Celsius between the chamber body and a substrate support arranged within the chamber body during introduction of the chlorine ($Cl_2$) gas-containing fill into the chamber body and etching of at least a portion of the silicon-containing accretion using the chlorine ($Cl_2$) gas-containing fill.

In addition to one or more of the features described above, or as an alternative, further examples of the method may include that temperature of the chamber body is decreased to between about 275 degrees Celsius and about 400 degrees Celsius during introduction of the chlorine ($Cl_2$) gas-containing fill into the chamber body and etching at least a portion of the silicon silicon-containing accretion with the chlorine ($Cl_2$) gas-containing fill.

In addition to one or more of the features described above, or as an alternative, further examples of the method may include that temperature of a substrate support arranged within the chamber body (e.g., a silicon carbide coating overlaying a bulk graphite material) is decreased to between about 400 degrees Celsius and about 575 degrees Celsius during introduction of the chlorine ($Cl_2$) gas-containing fill into the chamber body and etching at least a portion of the silicon-containing accretion using the chlorine ($Cl_2$) gas-containing fill.

In addition to one or more of the features described above, or as an alternative, further examples of the method may include that introducing the chlorine ($Cl_2$) gas-containing fill into the chamber body includes intermixing a chlorine ($Cl_2$) gas with a nitrogen ($N_2$) gas and providing the intermixed chlorine ($Cl_2$) gas and nitrogen ($N_2$) gas to the chamber body.

In addition to one or more of the features described above, or as an alternative, further examples of the method may include that introducing the chlorine ($Cl_2$) gas-containing fill into the chamber body includes introducing chlorine ($Cl_2$) gas into the chamber body at between about 50 standard cubic centimeters per minute and about 500 standard cubic centimeters per minute while either (or both) an isolation valve and a pressure control valve coupling the chamber body to an exhaust source is closed.

In addition to one or more of the features described above, or as an alternative, further examples of the method may include reducing (or ceasing) flow of a shaft purge provided to a tube member extending about a shaft member fixed to a lower wall of the chamber body and defining a gap therebetween. The shaft member may extend through the tube member. The tube member may be fixed in rotation relative to a substrate support arranged within the chamber body and supported for rotation within the chamber body about a rotation axis.

A semiconductor processing system is provided. The semiconductor processing system includes a first precursor source, a chlorine ($Cl_2$) gas source, a chamber body, a substrate support, an exhaust source, and a controller. The first precursor source includes a silicon-containing material layer precursor and the chlorine ($Cl_2$) gas source includes chlorine ($Cl_2$) gas. The chamber body is formed from quartz and is connected to the first precursor source and the chlorine ($Cl_2$) gas source. The substrate support is arranged within the chamber body, is formed from a bulk graphite material, and has a silicon carbide coating. The exhaust source is coupled to the chamber body by an isolation valve and a pressure control valve. The controller is operably connected to the semiconductor processing system and includes a memory having a non-transitory machine-readable medium with instructions recorded thereon that, when read by the processor, cause the processor to flow the silicon-containing material layer precursor from the first precursor source through the chamber body, form a silicon-containing accretion within the chamber body using the silicon-containing material layer precursor, introduce a chlorine ($Cl_2$) gas-containing fill into the chamber body from the chlorine ($Cl_2$) gas source by closing either (or both) the isolation valve and a pressure control valve coupled to the chamber body, etch at least a portion of the silicon-containing accretion with the chlorine ($Cl_2$) gas-containing fill; and remove the chlorine ($Cl_2$) gas-containing fill and a silicon-containing etchant product from the chamber body by opening either (or both) the isolation valve and the pressure control valve coupled to the chamber body.

In addition to one or more of the features described above, or as an alternative, further examples of the semiconductor processing system may include a chlorine ($Cl_2$) gas-containing fill impounded within the interior of chamber body.

A computer program product is provided. The computer program product includes a non-transitory machine-readable medium having instructions recorded thereon that, when read by a processor, cause the processor to flow a silicon-containing material layer precursor through a chamber body, form a silicon-containing accretion within the chamber body, introduce a chlorine ($Cl_2$) gas-containing fill into the chamber body, etch at least a portion of the silicon-containing accretion using the chlorine ($Cl_2$) gas-containing fill, and remove the chlorine ($Cl_2$) gas-containing fill and a silicon-containing etchant product from the chamber body.

In addition to one or more of the features described above, or as an alternative, further examples of the semiconductor processing system may include a silicon-containing accretion and an exposed silicon carbide surface bounding the chlorine ($Cl_2$) gas-containing fill.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
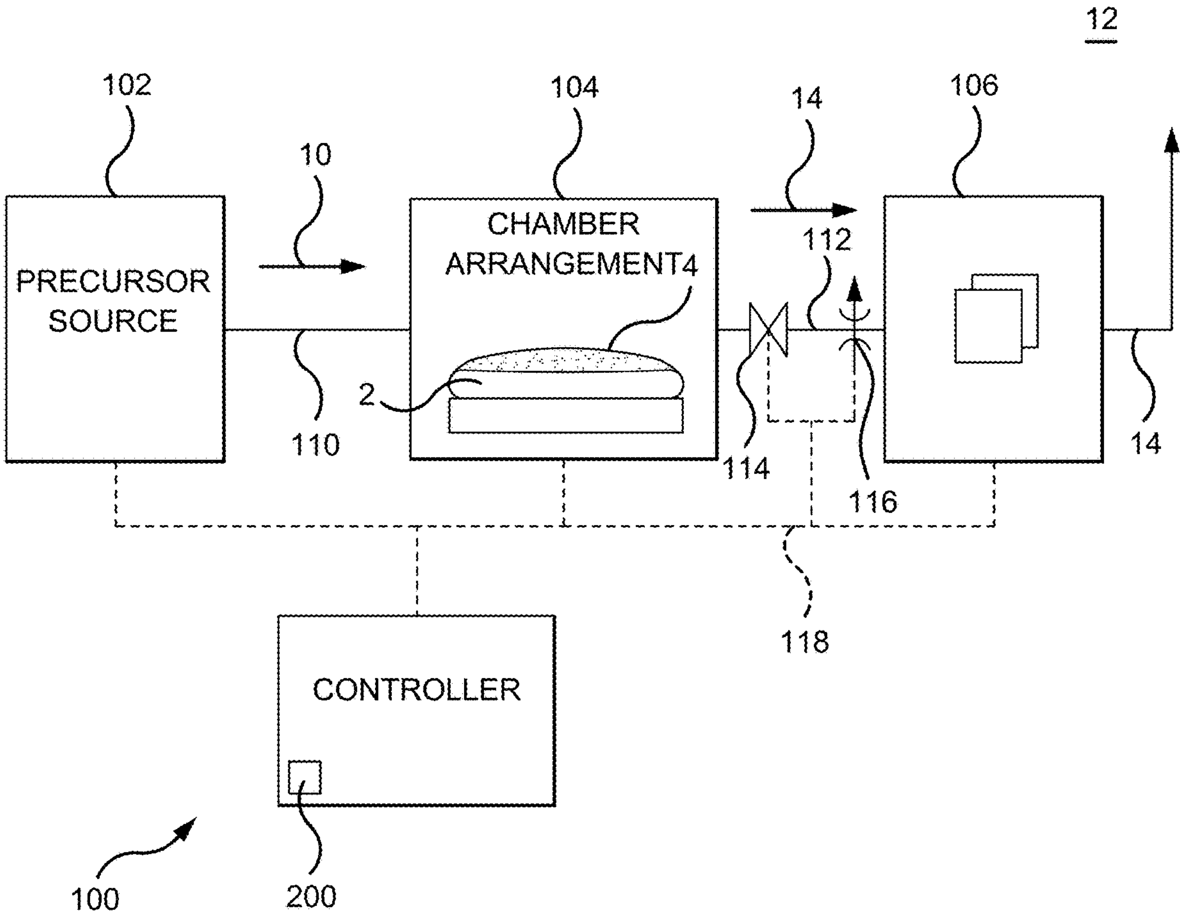
FIG. 1 is a schematic view of a semiconductor processing system in accordance with the present disclosure, showing a precursor delivery arrangement providing chlorine ($Cl_2$) to a chamber arrangement to remove a collateral deposition from the chamber arrangement.

FIGS. 4-7 are schematic views of the semiconductor processing system of FIG. 1 according to an example of the present disclosure, showing the chamber arrangement being purged and thereafter etched using a flow of chlorine between material layer deposition operations; and FIGS. 8-14 are block diagrams of examples of material layer deposition methods, showing operations of the material layer deposition methods according to illustrative and non-limiting examples of the material layer deposition methods.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a partial view of a semiconductor processing system in accordance with the present disclosure is shown in FIG. 1 and is designated generally by reference character 100. Other examples of semiconductor processing systems, computer program products, and material layer deposition methods, or aspects thereof, are provided in FIGS. 2-14, as will be described. The systems and methods of the present disclosure may be used to remove silicon-containing accretions formed within semiconductor processing systems during the deposition of material layers onto substrates supported therein, such as accretions formed on quartz surfaces and silicon carbide surfaces during the deposition of silicon-containing epitaxial material layers in semiconductor processing systems having single-wafer crossflow chamber architectures, though the present disclosure is not limited to epitaxial material layers or to any particular chamber architecture in general.

Referring to FIG. 1, the semiconductor processing system 100 is shown. The semiconductor processing system 100 generally includes a precursor delivery arrangement 102, a chamber arrangement 104, an exhaust source 106, and a controller 108. The precursor delivery arrangement 102 is connected to the chamber arrangement 104 by a precursor supply conduit 110 and is configured to provide a flow of a material layer precursor 10 to the chamber arrangement 104. The chamber arrangement 104 is configured to expose a substrate 2 supported therein to the material layer precursor 10 to deposit a material layer 4 onto the substrate 2 and is connected to the exhaust source 106 by an exhaust conduit 112. The exhaust source 106 is fluidly coupled to an external environment 12 outside of the semiconductor processing system 100 and is configured to communicate a flow of residual material layer precursor and/or reaction products 14 issued by the chamber arrangement 104 to the external environment 12 and may include one or more of a vacuum pump and an abatement apparatus like a scrubber. In this respect it is contemplated that the exhaust conduit 112 may have an isolation valve 114 and a pressure control valve 116 connected in series with one another and coupling the exhaust source 106 to the chamber arrangement 104, the isolation valve 114 configured to fluidly separate the chamber arrangement 104 from the exhaust source 106, the pressure control valve 116 configured to maintain a predetermined pressure within the chamber arrangement 104 by throttling mass flow therethrough.

Figure 8:
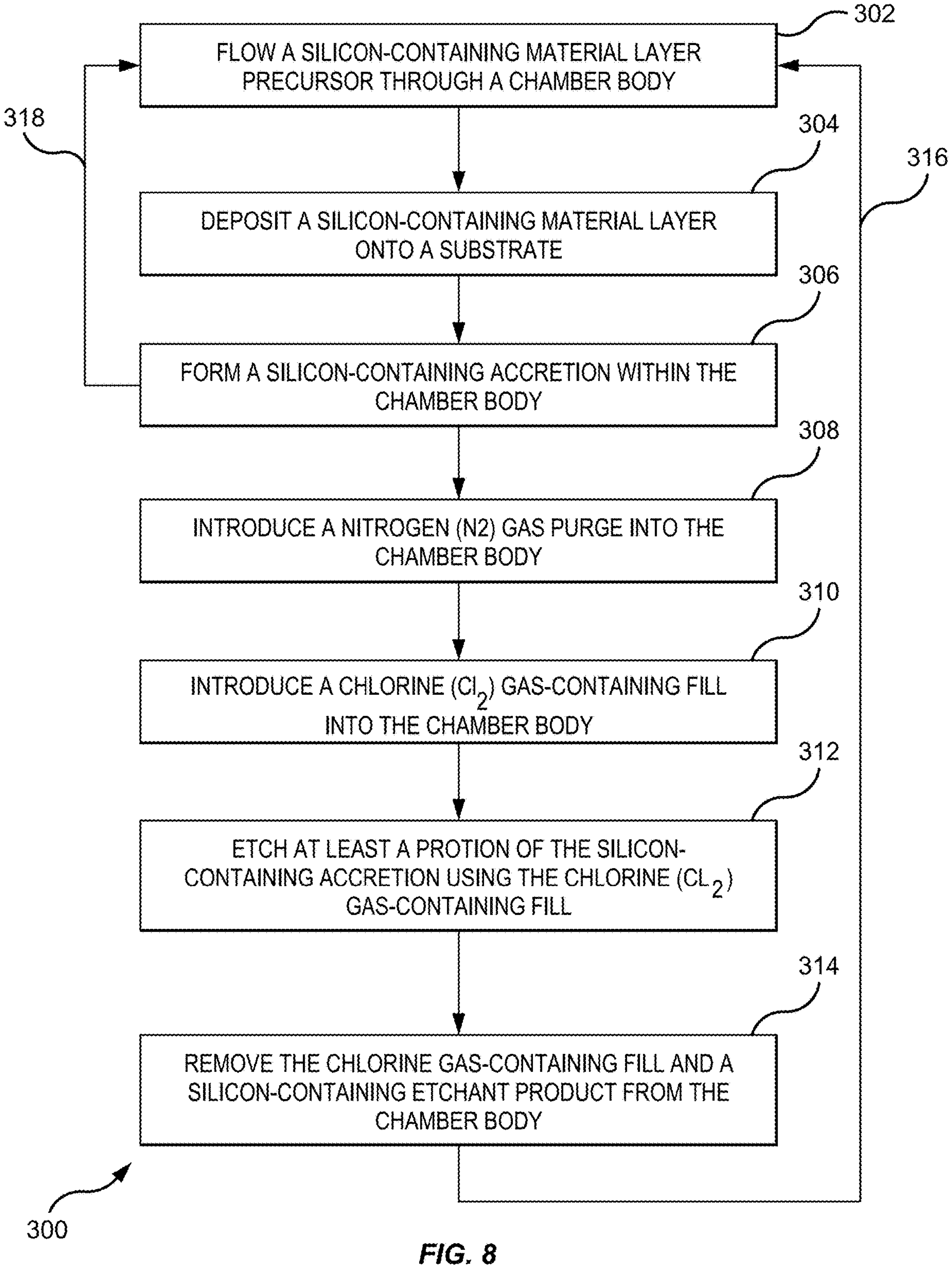

The controller 108 is operably connected to the precursor delivery arrangement 102 and the chamber arrangement 104, for example through a wired or wireless link 118, and is configured to execute operations of a material layer deposition method 300 (shown in FIG. 8). In this respect it is contemplated that the controller 108 be configured to (a) flow a silicon-containing material layer precursor, e.g., the first material layer precursor 16 (shown in FIG. 2), through a chamber body 144 (shown in FIG. 3) included in the chamber arrangement 104; (b) form a silicon-containing accretion 32 (shown in FIG. 4) within the chamber body 144; (c) introduce a chlorine ($Cl_2$) gas-containing fill into the chamber body 144, e.g., the chlorine ($Cl_2$) gas-containing fill 20 (shown in FIG. 6); (d) etch at least a portion of the silicon-containing accretion 32 using the chlorine ($Cl_2$) gas-containing fill 20; and (e) remove the chlorine ($Cl_2$) gas-containing fill and a silicon-containing etchant product from the chamber body 144. It is contemplated that the controller 108 may accomplish one or more of the aforementioned operations in cooperation with a computer program product 200, and that the computer program product 200 may in turn include a non-transitory machine-readable medium such as a memory having instructions recorded therein that when read by the processor included in the controller 108, cause the controller 108 to execute the aforementioned operations.

As used herein the term "substrate" may refer to any underlying material or materials, including any underlying material or materials that may be modified, or upon which, a device, a circuit, or a film may be formed. A substrate may be continuous or non-continuous; rigid or flexible; solid or porous; and combinations thereof. A substrate may be in any form such as (but not limited to) a powder, a plate, or a workpiece. A substrate in the form of a plate may include a wafer in various shapes and sizes, for example, a 300-millimeter wafer.

A substrate may be formed from semiconductor materials, including, for example, silicon (Si), silicon-germanium (SiGe), silicon oxide ($SiO_2$), gallium arsenide (GaAs), gallium nitride (GaN) and silicon carbide (SiC). A substrate may include a pattern or may an unpatterned, blanket-type substrate. As examples, substrates in the form of a powder may have applications for pharmaceutical manufacturing. A porous substrate may include one or more polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, a continuous substrate may move through the process chamber such that the process continues until the end of the substrate is reached. A continuous substrate may be supplied from a continuous substrate feeding system to allow for manufacture and output of the continuous substrate in any appropriate form. Non-limiting examples of continuous substrates may include sheets, non-woven films, rolls, foils, webs, flexible materials, bundles of continuous filaments or fibers (for example, ceramic fibers or polymer fibers). A continuous substrate may also comprise a carrier or sheet upon which one or more non-continuous substrate is mounted.

Figure 2:
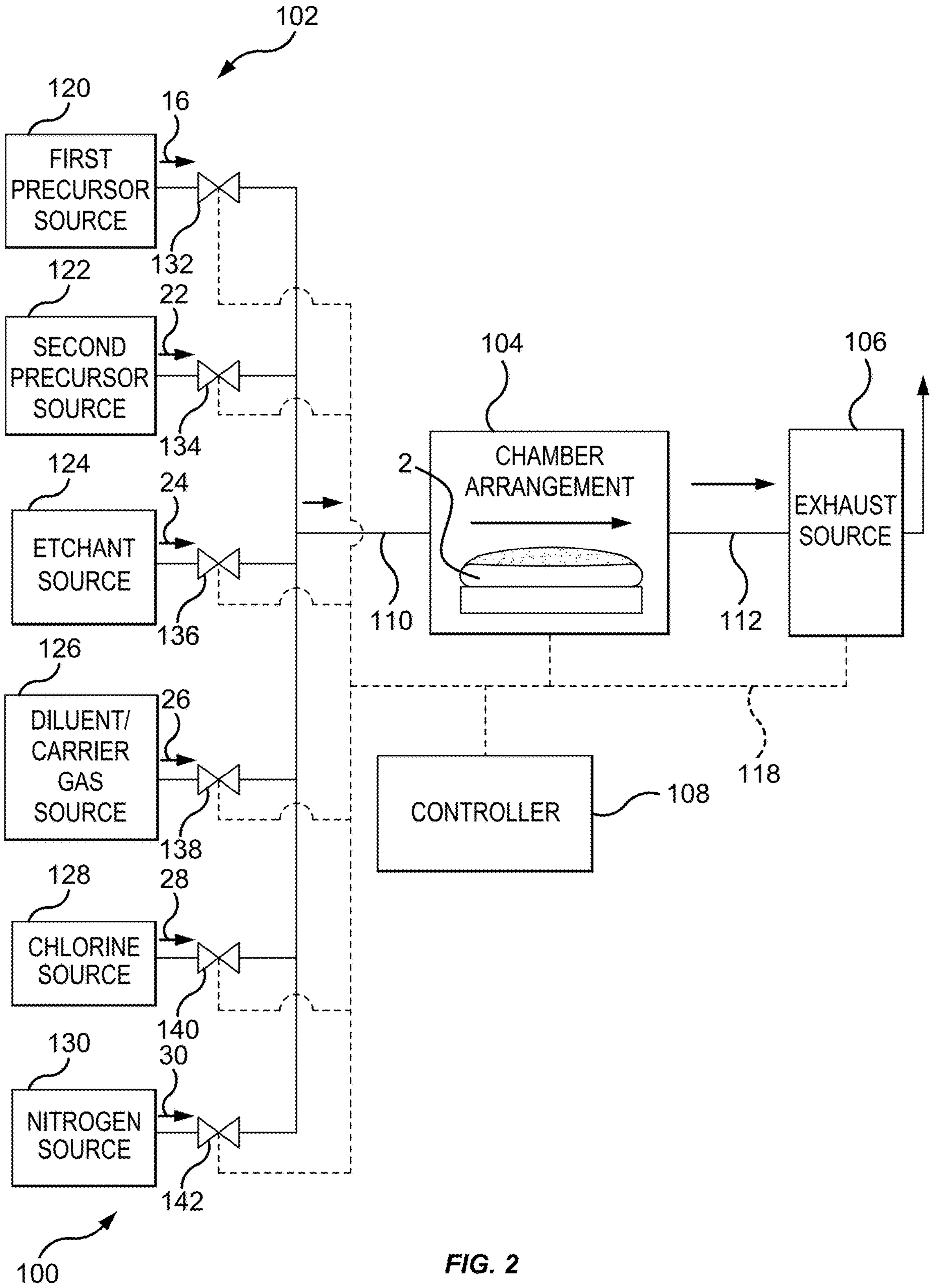
FIG. 2 is a schematic view of the semiconductor processing system of FIG. 1 according to an example, showing a chlorine source and a nitrogen source connected to the chamber arrangement to remove the collateral deposition from within the chamber arrangement.

With reference to FIG. 2, the precursor delivery arrangement 102 is shown according to an example of the present disclosure. In the illustrated example the precursor delivery arrangement 102 includes a first precursor source 120, a second precursor source 122, and an etchant source 124. As shown and described herein the precursor delivery arrangement 102 also includes a diluent/carrier gas source 126, a chlorine ($Cl_2$) gas source 128, and a nitrogen ($N_2$) gas source 130. Although shown and described herein as having certain elements and a specific arrangement it is to be understood and appreciated that the precursor source may include other elements and/or omit elements shown and described herein, or have a different arrangement than shown and described herein, and remain within the scope of the present disclosure.

The first precursor source 120 includes the first material layer precursor 16 and is configured to provide a flow of the first material layer precursor 16 to the chamber arrangement 104. In this respect it is contemplated that the first precursor source 120 be coupled to the precursor supply conduit 110 by a first precursor supply valve 132. The first precursor supply valve 132 is in turn may be operably associated with the controller 108, for example through the wired or wireless link 118, and may be a component of a mass flow controller (MFC) or mass flow metering device. In this respect the precursor delivery arrangement 102 may be as shown and described in U.S. Pat. No. 11,053,591 to Ma et. Al., issued on Jul. 6, 2021, the contents of which are incorporated herein by reference in their entirety. In certain examples, the first material layer precursor 16 may include a silicon-containing material layer precursor, such as chlorinated silicon-containing material layer precursor and/or a non-chlorinated silicon-containing material layer precursor. Examples of suitable non-chlorinated silicon-containing materials include silane ($SiH_4$) and disilane ($S_2H_6$). In accordance with certain examples, the first material layer precursor 16 may include a chlorinated silicon-containing material layer precursor. Examples of suitable chlorinated silicon-containing materials include dichlorosilane ($SiH_2Cl_2$) and trichlorosilane ($HCl_3Si$). In accordance with certain examples, the first precursor source 120 may include two or more silicon-containing material layer precursors and remain within the scope of the present disclosure.

The second precursor source 122 is similar to the first precursor source 120 and in this respect is connected to the chamber arrangement 104 by a second precursor supply valve 134. It is contemplated that the second precursor source 122 additionally include a second material layer precursor 22 and be configured to provide a flow of the second material layer precursor 22 to the chamber arrangement 104 through the second precursor supply valve 134. In certain examples, the second material layer precursor 22 may include a metallic material, such as germanium and/or gallium. In accordance with certain examples, the second material layer precursor 22 may include a dopant-containing material, such as p-type dopant and/or an n-type dopant. Examples of suitable dopants include phosphorous (P), boron (B), and arsenic (As). In accordance with certain examples, the second material layer precursor 22 may include two or more of the aforementioned materials and remain within the scope of the present disclosure.

The etchant source 124 and diluent/carrier gas source 126 are also similar to the first precursor source 120 and are connected to the precursor supply conduit 110 through an etchant supply valve 136 and a diluent/carrier gas supply valve 138, respectively. The etchant source 124 additionally includes an etchant 24 and is configured to provide a flow of the etchant 24 to the chamber arrangement 104. In this respect it is contemplated that the etchant 24 may be co-flowed to the chamber arrangement 104 with either (or both) the first material layer precursor 16 and/or the second material layer precursor 22, for example, to provide selectivity in the deposition of the material layer 4 according to composition of exposed surface portions of the substrate 2. It is also contemplated that the etchant 24 may be provided to the chamber arrangement 104 separately from either or both the first material layer precursor 16 and the second material layer precursor 22, for example to supplement cleaning performed using the chlorine ($Cl_2$) gas-containing fill 20 (shown in FIG. 6). In certain examples, the etchant 24 may include hydrochloric (HCl) acid. It is contemplated that the diluent/carrier gas source 126 include a diluent/carrier gas 26, such as hydrogen ($H_2$) gas and/or nitrogen ($N_2$) gas, which may be co-flowed with one or more first material layer precursor 16 and the second material layer precursor 22 as well as the etchant 24 to the chamber arrangement 104, as appropriate for the deposition technique being employed.

The chlorine ($Cl_2$) gas source 128 and the nitrogen ($N_2$) gas source 130 are similar to the first precursor source 120 and are additionally configured to provide a flow of chlorine ($Cl_2$) gas 28 and nitrogen ($N_2$) gas 30 to the chamber arrangement 104. In this respect it is contemplated that the chlorine ($Cl_2$) gas source 128 be configured to provide a flow of chlorine ($Cl_2$) gas 28 to the chamber arrangement 104 through a chlorine supply valve 140 to make up the chlorine ($Cl_2$) gas-containing fill 20, and that the nitrogen ($N_2$) gas source 130 be configured to provide a flow of nitrogen ($N_2$) gas 30 through a nitrogen supply valve 142 to the chamber arrangement 104. Advantageously, incorporation of the chlorine ($Cl_2$) gas source 128 in the precursor delivery arrangement 102 enables cleaning interior surfaces located within the chamber arrangement 104 at relatively low temperature using chlorine ($Cl_2$) gas in comparison to cleaning techniques employing hydrochloric (HCl) acid. To further advantage, including the nitrogen ($N_2$) gas source 130 enables purging the chamber arrangement 104 prior to introduction of chlorine ($Cl_2$) gas into the chamber arrangement 104, displacing materials exothermically reactive with chlorine ($Cl_2$) gas, improving temperature control within the chamber arrangement 104 during cleaning with chlorine ($Cl_2$) gas subsequent to establishment of a nitrogen ($N_2$) purge atmosphere within the chamber arrangement 104.

Figure 3:
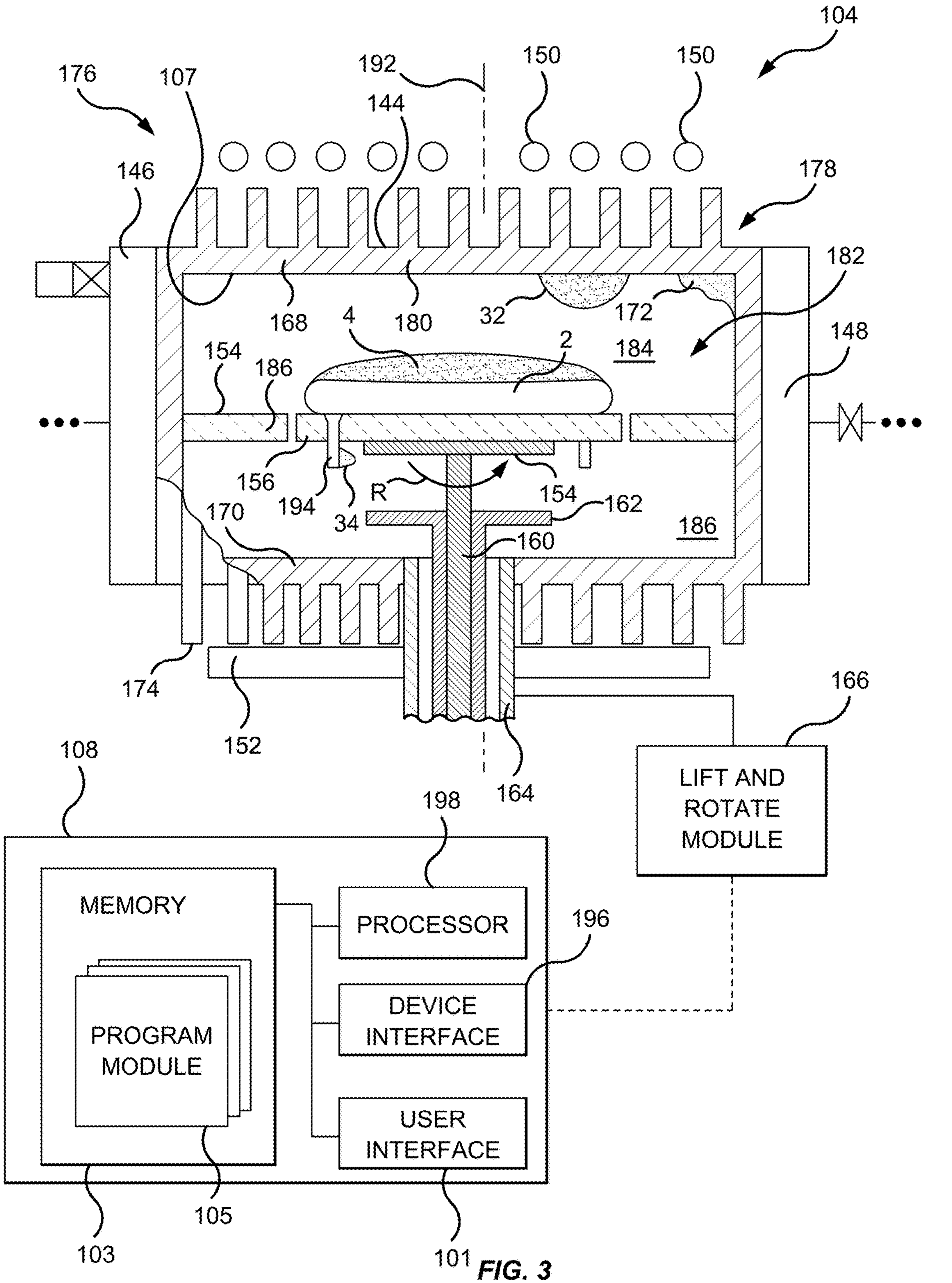
FIG. 3 is a schematic view of the chamber arrangement of FIG. 1 according to an example, showing internal structure of the chamber arrangement and fluid conduits connecting the precursor delivery arrangement to the chamber arrangement.

With reference to FIG. 3, the chamber arrangement 104 is shown according to an example of the present disclosure. In the illustrated example the chamber arrangement 104 includes a chamber body 144, an injection flange 146, and an exhaust flange 148. The chamber arrangement 104 also includes an upper heater element array 150, a lower heater element array 152, a divider 154, and a substrate support 156. As shown and described herein the chamber arrangement 104 further includes a support member 158, a shaft member 160, a lift pin actuator 162, a tube member 164, and a lift and rotate module 166. Although shown and described herein as including specific elements and having a specific architecture, e.g., a single-wafer crossflow architecture, it is to be understood and appreciated that the chamber arrangement 104 may include additional elements and/or exclude elements shown and described herein, as well as have a different architecture, in other examples of the present disclosure and remain within the scope of the present disclosure.

The chamber body 144 includes an upper wall 168, a lower wall 170, a first sidewall 172, and a second sidewall 174. The upper wall 168 of the chamber body 144 extends longitudinally between an injection end 176 and a longitudinally opposite exhaust end 178 and is formed from a transparent material 180. It is contemplated that the transparent material 180 be transparent to electromagnetic radiation within an infrared waveband, the upper wall 168 thereby communicating radiant energy generated by the upper heater element array 150 into an interior 182 of the chamber body 144. Examples of suitable transparent materials include ceramic materials such as quartz, fused silica, and sapphire. The lower wall 170 of the chamber body 144 is similar to the upper wall 168 of the chamber body 144, also longitudinally spans the injection end 176 and the exhaust end 178 of the chamber body 144, and is further spaced apart from the upper wall 168 of the chamber body 144 by the interior 182 of the chamber body 144. It is contemplated that the first sidewall 172 and the second sidewall 174 also be similar to the upper wall 168 of the chamber body 144, the first sidewall 172 coupling the upper wall 168 to the lower wall 170, the second sidewall 174 also coupling the upper wall 168 to the lower wall 170 and additionally spaced apart by the first sidewall 172 by the interior 182 of the chamber body 144. As shown and described herein the upper wall 168 and the lower wall 170 are substantially planar and the chamber body 144 further has a plurality of exterior ribs extending laterally about the exterior of the chamber body 144. As will be appreciated by those of skill in the art in view of the present disclosure, either (or both) the upper wall 168 and the lower wall 170 may define an arcuate profile and/or be domelike, and/or the chamber body 144 have no exterior ribs and remain within the scope of the present disclosure.

The upper heater element array 150 is supported above the upper wall 168 of the chamber body 144 and is configured to communicate radiant heat into the interior 182 of the chamber body 144, for example using electromagnetic radiation within an infrared waveband. In this respect the upper heater element array 150 may include a plurality of filament-type lamps spaced apart from one another above the upper wall 168 of the chamber body 144. In certain examples the upper heater element array 150 may include a plurality of linear filament-type lamps extending laterally between the first sidewall 172 and the second sidewall 174 of the chamber body 144 and longitudinally spaced apart from one another between the injection end 176 and the exhaust end 178 of the chamber body 144. The lower heater element array 152 may be similar to the upper heater element array 150, additionally be supported below the lower wall 170 of the chamber body 144, and further include a plurality of linear filament-type lamps. The plurality of linear filament-type lamps may extend longitudinally between the injection end 176 and the exhaust end 178 of the chamber body 144 and be laterally spaced apart from one another between the first sidewall 172 and the second sidewall 174 of the chamber body 144. It is contemplated that either (or both) the upper heater element array 150 and the lower heater element array 152 may include bulb-type lamps and remain within the scope of the present disclosure.

The divider 154 is fixed within the interior 182 of the chamber body 144 and divides the interior 182 of the chamber body 144 into an upper chamber 184 and a lower chamber 186. It is contemplated that the divider 154 define a divider aperture 188 therethrough fluidly coupling the upper chamber 184 to the lower chamber 186. It is contemplated that the divider 154 be formed from an opaque material 190, e.g., a material opaque to electromagnetic radiation within an infrared waveband, and that the substrate support 156 (e.g., a susceptor) be supported within the divider aperture 188 for rotation R about a rotation axis 192. Examples of suitable opaque materials include ceramic materials, such as silicon carbide. Examples of suitable opaque materials also include carbonaceous materials such as graphite and pyrolytic carbon.

The substrate support 156 is configured to support the substrate 2 during deposition of the material layer 4 thereon, for example using an edge support technique. It is contemplated that the substrate support 156 slidably receive therein a plurality of lift pins 194 for seating and unseating the substrate 2 from the substrate support 156 in cooperation with the lift pin actuator 162, and that the substrate support 156 be operably coupled to the lift and rotate module 166 by the support member 158 and the shaft member 160. In this respect it is contemplated that the support member 158 be arranged within the lower chamber 186 of the chamber body 144 and along the rotation axis 192, be fixed in rotation relative to the substrate support 156 and couple the support member 158 to the shaft member 160. The shaft member 160 in turn extends through the lower wall 170 of the chamber body 144, is fixed in rotation relative to the support member 158, and operably couples the substrate support 156 to the lift and rotate module 166 through the support member 158. It is contemplated that the either (or both) the support member 158 and the shaft member 160 be formed from a transmissive material, for example the transparent material 180, and that that the lift pin actuator 162 extend circumferentially about the shaft member 160 and define a gap 113 between an interior surface of the shaft member 160 and an exterior surface of the shaft member 160. It is also contemplated that the substrate support 156 be formed from an opaque material, for example a bulk graphite material coated with silicon carbide or pyrolytic carbon, and remain within the scope of the present disclosure.

The controller 108 includes a device interface 19, a processor 198, a user interface 101, and a memory 103. The device interface 196 connects the processor 198 to the wired or wireless link 118 and therethrough to other elements of semiconductor processing system 100 (shown in in FIG. 1), for example to the precursor delivery arrangement 102 and the chamber arrangement 104. The processor 198 is operatively connected to the user interface 101 to receive user input therethrough and/or provide user output and is disposed in communication with the memory 103. The memory 103 has a plurality of program modules 105 recorded thereon containing instructions that, when read by the processor 198, cause the processor 198 to execute certain operations. Among the operations are operations of the material layer deposition method 300 (shown in FIG. 8), as will be described.

As has been explained above, in some material layer deposition processes, accretions may form within the interior 182 of the chamber body 144. For example, silicon-containing accretions (e.g., a silicon-containing accretion 32) may form on quartz surfaces within the interior 182 of the chamber body 144, for example on an interior surface 107 (e.g., an exposed quartz surface) of the upper wall 168 of the chamber body 144. Once formed, such accretions may limit the reliability of the semiconductor processing system 100, for example by reducing transmissivity of the transparent material 180 forming the chamber body 144 and limiting the ability of the upper heater element array 150 to communicate radiant heat into the interior 182 of the chamber body 144. Silicon-containing accretions (e.g., the silicon-containing accretion 34) may also form on structures located within the chamber body 144, such as onto silicon carbide surfaces of the substrate support 156 and/or onto one or more of the plurality of lift pins 194. Once formed, such accretions can also limit reliability of the semiconductor processing systems 100, for example when the accretion forms or is carried into a mechanical clearance defined between parts otherwise free to move relative to one another.

One approach to chamber cleaning is provide a flow of hydrochloric (HCl) to the chamber body 144 to etch silicon-containing accretions formed during deposition. And while generally effective for its intended purpose, hydrochloric (HCl) acid can, in some semiconductor processing systems, limit reliability and/or increase cost of ownership of the semiconductor processing system. In this respect chamber cleaning with hydrochloric (HCl) can require that that the chamber body being cleaned be heated to a relatively high temperature for efficacy, for example to a temperature greater than that required for material layer deposition, increasing power consumption and exerting greater strain on chamber components than otherwise associated with thermal cycling during processing. Hydrochloric (HCl) acid can also debit the service life of chamber consumables, such as by etching exposed silicon carbide coatings otherwise required to protect the bulk material underlying and protecting the bulk material forming the structure. And the hydrochloric (HCl) acid itself imposes a cost on the semiconductor processing system employing hydrochloric (HCl) acid for chamber cleaning, for example due to the cost of the hydrochloric (HCl) acid consumed during cleaning as well as the costs (e.g., environmental) associated with abating the hydrochloric (HCl) acid issued by the chamber during the cleaning process. Moreover, much of the hydrochloric (HCl) acid provided to the chamber may never contact (or etch) the silicon-containing accretion targeted for removal, the hydrochloric (HCl) instead flowing through the chamber and going directly to a scrubber for removal and abatement.

To avoid one or more of the aforementioned disadvantages, the semiconductor processing system 100 (shown in FIG. 1) is configured to remove silicon-containing accretions from within the chamber arrangement 104 using chlorine ($Cl_2$) gas. In this respect the semiconductor processing system 100 is configured to maintain a temperature differential between the chamber body 144 and the interior structures within the chamber body 144, for example between the upper wall 168 and the substrate support 156, to limit etching of the substrate support 156 by the chlorine ($Cl_2$) gas employed for removing silicon-containing accretions from the interior surface 107 of the upper wall 168 of the chamber body 144. In further respect, a chlorine ($Cl_2$) gas fill may be employed for the chamber clean, i.e., the interior 182 of the chamber body 144 charged or filled with chlorine ($Cl_2$) gas while fluidly separated from the exhaust source 106 (shown in FIG. 1), limiting the amount of etchant required for cleaning by increasing residency time of chlorine ($Cl_2$) gas provided to the chamber arrangement 104 relative to cleaning techniques where etchant is flowed through the chamber body 144.

Figure 4:
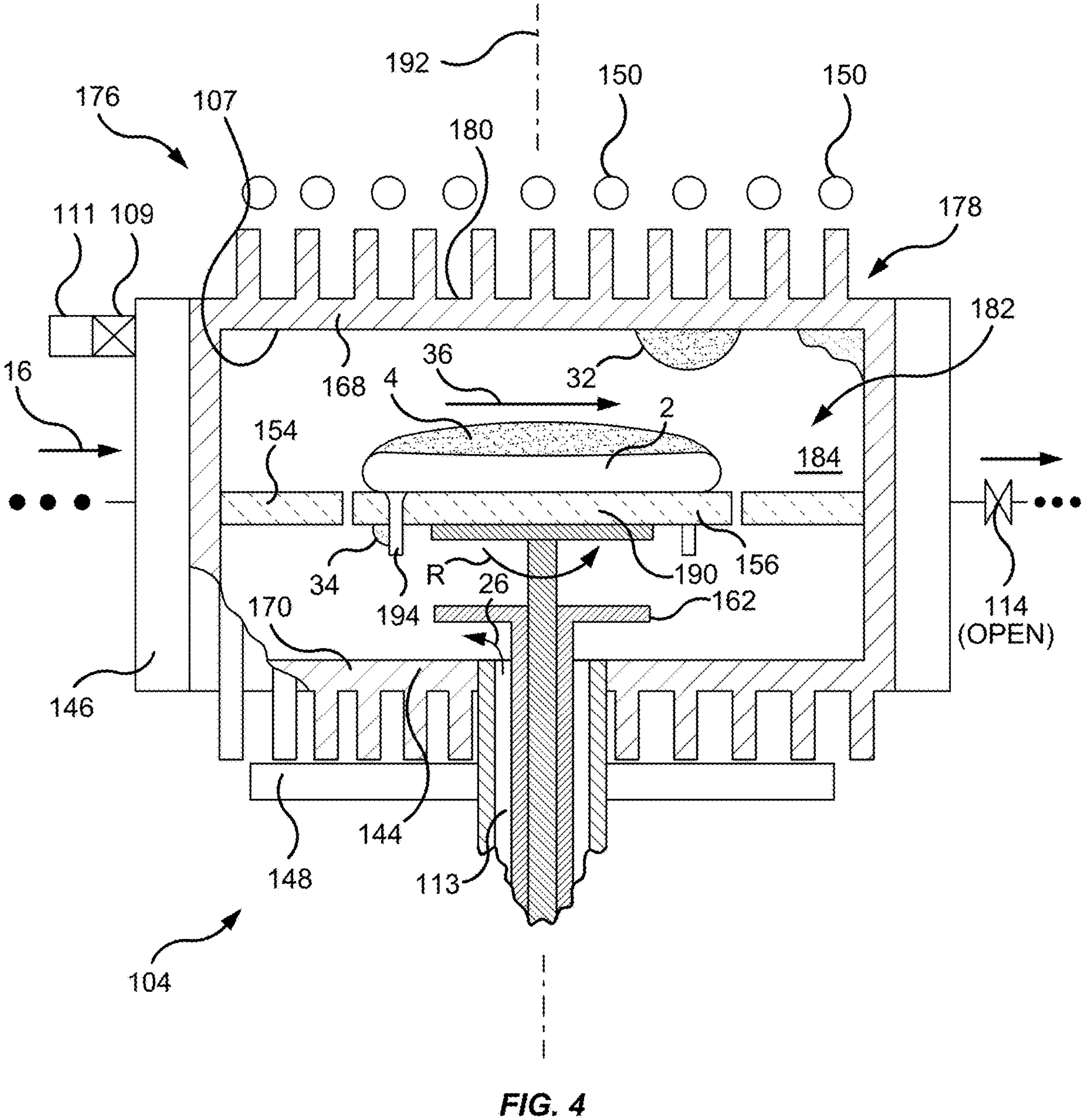
Figure 5:
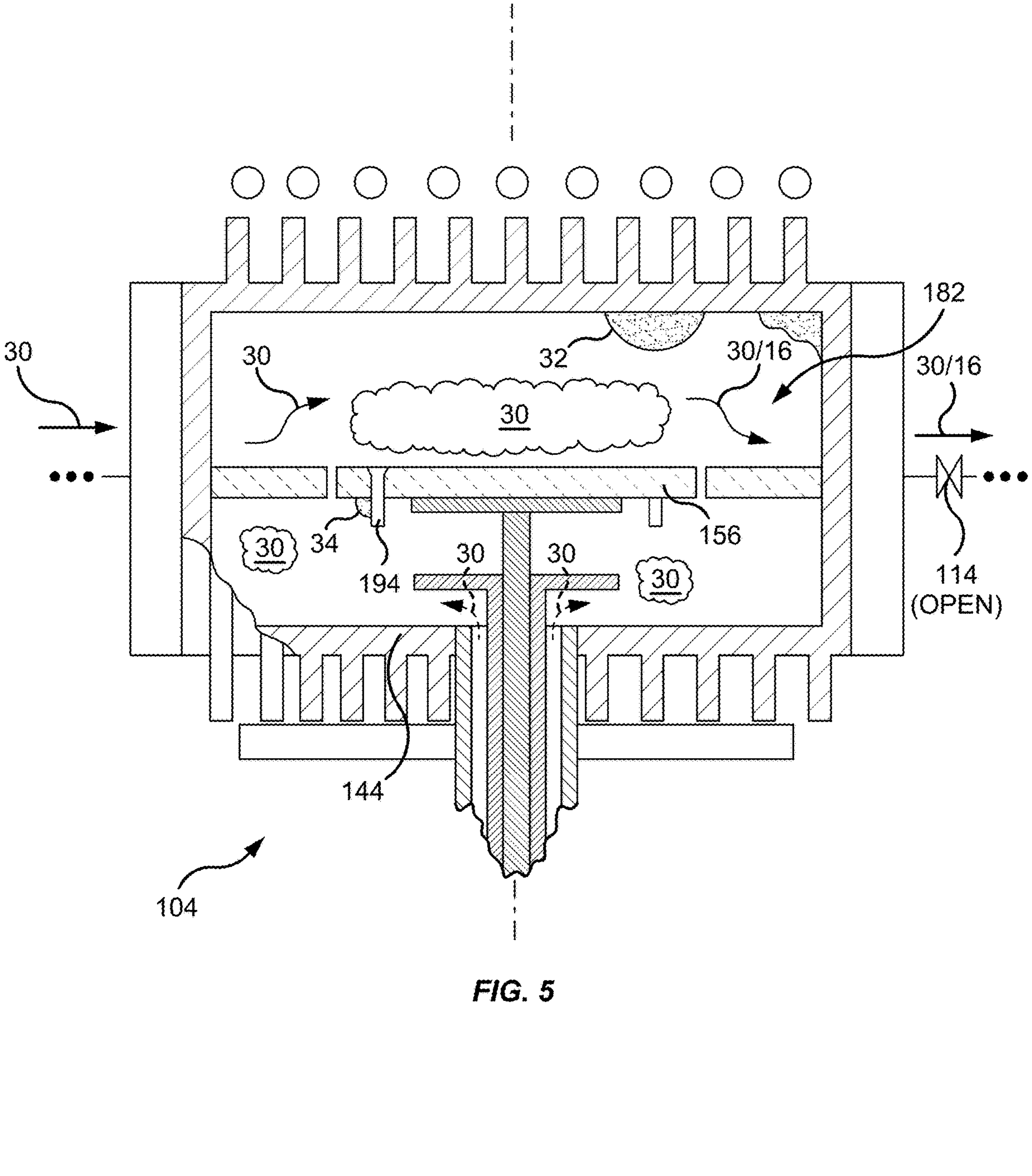
Figure 6:
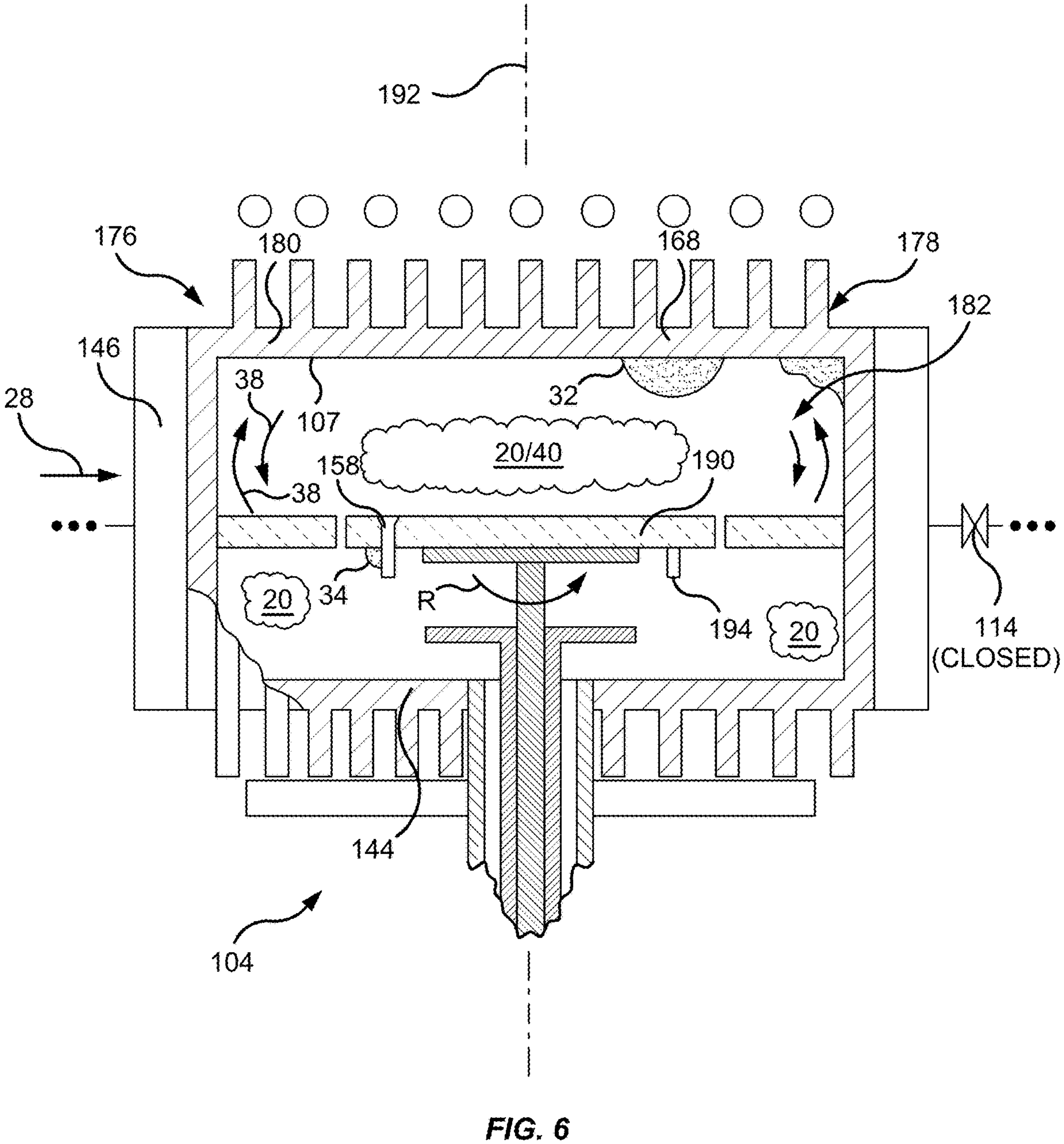
Figure 7:
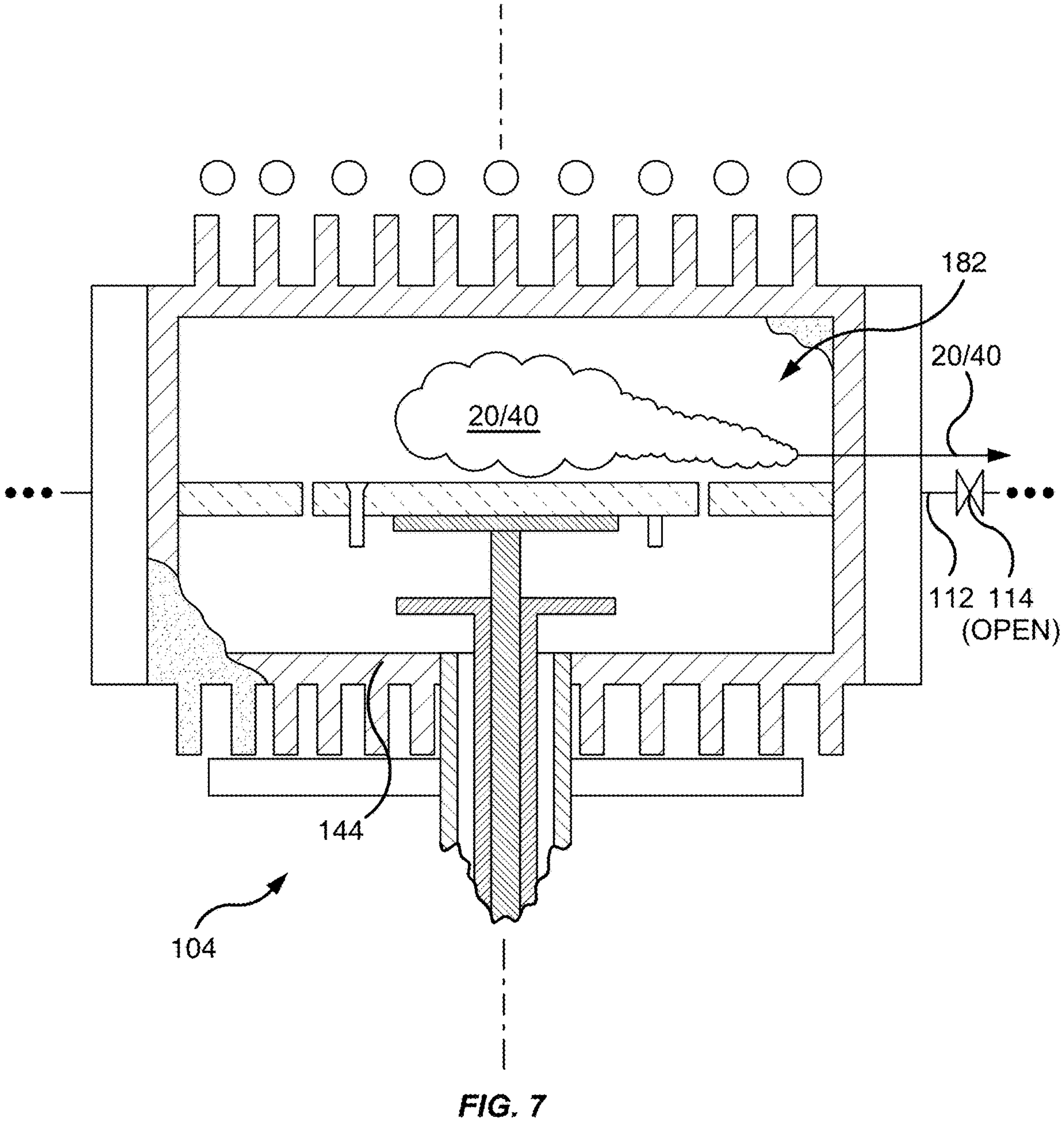

With reference to FIGS. 4-7, formation and subsequent removal of silicon-containing accretions from within the interior 182 of the chamber arrangement 104 is shown. As shown in FIG. 4, silicon-containing accretions may be formed within the chamber arrangement 104 collateral to deposition of the material layer 4 onto the substrate 2 using the silicon-containing material layer precursor flowed through the chamber body 144. For example, the silicon-containing accretion 32 may form on the transparent material 180 forming the interior surface 107 of the upper wall 168 of the chamber body 144. The silicon-containing accretion 34 may alternatively or additionally form on the opaque material 190 forming one or more of the divider 154, the substrate support 156, and/or the plurality of lift pins 194. As shown in FIG. 5, the interior 182 of the chamber body 144 may thereafter be purged prior removal of the silicon-containing accretion 32 and/or the silicon-containing accretion 34, for example to remove materials potentially reactive with chlorine ($Cl_2$) gas employed for removal of the silicon-containing accretion 32 and/or the silicon-containing accretion 34. As shown in FIG. 6, the chlorine ($Cl_2$) gas-containing fill 20 may then be introduced into the interior 182 of the chamber body 144, the chlorine ($Cl_2$) gas etching (and thereby removing) the silicon-containing accretion 32 and/or the silicon-containing accretion 34 from within the interior 182 of the chamber body 144. Introduction of the chlorine ($Cl_2$) gas-containing fill 20 and/or etching may be accomplished with either (or both) the isolation valve 114 and PCV 116 closed, the chlorine ($Cl_2$) gas 28 making up the chlorine ($Cl_2$) gas-containing fill 20 fill thereby impounded within the chamber body 144 during etching of the silicon-containing accretion 42. Advantageously, closing the isolation valve 114 during introduction of the chlorine ($Cl_2$) gas 28 into the chamber body 144 circulate the chlorine ($Cl_2$) gas within the interior 182 of the chamber body 144 according to a turbulent flow pattern 38 to saturate the interior 182 of the chamber body 144 with the chlorine ($Cl_2$) gas 28, increasing mean free path to the exhaust end 178 of the chamber body 144 to limit the amount of chlorine ($Cl_2$) gas 28 required for cleansing. As shown in FIG. 7, the chlorine ($Cl_2$) gas-containing fill and silicon-containing etchant products 40 may thereafter be removed from the interior 182 of the chamber body 144, for example by opening the either (or both) isolation valve 114 and the PCV 116 to again expose the interior 182 of the chamber body 144 to the exhaust source 106.

Referring to FIG. 4, seating may be accomplished by for example by cooperation of the plurality of lift pins 194 with the lift pin actuator 162 in conjunction with the gate valve 109 and the substrate transfer robot 111. The substrate 2 is then heated to a predetermined material layer deposition temperature using either (or both) the upper heater element array 150 and the lower heater element array 152, and the silicon-containing material layer precursor flowed through the chamber body 144, the substrate 2 being supported within the chamber body 144 prior to flowing the silicon-containing material layer precursor to the chamber body 144 in accordance with certain examples of the present disclosure. It is contemplated that the substrate 2 be exposed to the silicon-containing material layer precursor as the silicon-containing material layer precursor flows through the chamber body 144, and that environment conditions be maintained within the chamber body 144 such that the material layer 4 deposits onto the substrate 2 using the silicon-containing material layer precursor according to an epitaxial deposition technique. In this respect it is contemplated that the pressure control valve 116 (shown in FIG. 1) cooperate with the exhaust source 106 (shown in FIG. 1) and the isolation valve 114 (shown in FIG. 1) such that one or more vacuum pump included in the exhaust source 106 maintains a predetermined material layer deposition pressure within the interior 182 of the chamber body 144.

Deposition of the material layer 4 may include intermixing a diluent/carrier gas, e.g., the diluent/carrier gas 26 (shown in FIG. 2), with the silicon-containing material layer precursor. The silicon-containing material layer precursor and the diluent/carrier gas 26 may be intermixed with one another by the injection flange 146, and the mixture of the silicon-containing material layer precursor and the diluent/carrier gas 26 thereafter flowed through the chamber body 144. In certain examples of the present disclosure the diluent/carrier gas 26 may include a material exothermically reactive with chlorine ($Cl_2$) gas, such as hydrogen ($H_2$) gas by way of non-limiting example. The silicon-containing material layer precursor (and in certain examples the silicon-containing material layer precursor intermixed with the diluent/carrier gas 26) may be flowed through the upper chamber 184 of the chamber body 144 using a laminar flow pattern 36, for example according to a substantially uniform cross-section flow area defined within the upper chamber 184 between the injection end 176 and the exhaust end 178 of the chamber body 144. In certain examples a shaft purge may be provided to the lower chamber 186 of the chamber body 144, for example using a flow of the diluent/carrier gas 26 provided by the diluent/carrier gas source 126 (shown in FIG. 2) via the gap 113 defined between the tube member 164 and the shaft member 160. In accordance with certain examples, the shaft purge may include (or consist of or consist essentially of) hydrogen ($H_2$) gas during deposition of the material layer 4.

Referring to FIG. 5, purging the interior 182 of the chamber body 144 may be accomplished subsequent to removal of the substrate 2 (shown in FIG. 1) from the chamber body 144 and prior to introducing the chlorine ($Cl_2$) gas-containing fill 20 (shown in FIG. 6) into the chamber body 144. In this respect a flow of the nitrogen ($N_2$) gas 30 may be provided to the chamber arrangement 104 and flowed through the interior 182 of the chamber body 144, for example using the precursor delivery arrangement 102 (shown in FIG. 1). The nitrogen ($N_2$) gas 30 may purge the interior 182 of the chamber body 144, the nitrogen ($N_2$) gas 30 displacing material potentially reactive with chlorine ($Cl_2$) gas, for example residual hydrogen ($H_2$) gas from the diluent/carrier gas 26 (shown in FIG. 2) intermixed with the silicon-containing material layer precursor. It contemplated that the interior 182 of the chamber body 144 may be fluidly separated from the exhaust source 106 (shown in FIG. 1) and one or more vacuum pump included therewith while the nitrogen ($N_2$) gas 30 is provided to the chamber arrangement 104, for example by closing either (or both) the isolation valve 114 and the PCV 116 coupling the chamber arrangement 104 to the exhaust source 106. It is also contemplated that the chlorine ($Cl_2$) gas-containing fill 20 may be introduced into the chamber body 144 while the interior 182 of the chamber body 144 is fluidly separated from the exhaust source 106 (and the one or more vacuum pump included therewith).

Referring to FIG. 6, introduction of the chlorine ($Cl_2$) gas-containing fill 20 into the chamber body 144 may be accomplished by providing a flow of the chlorine ($Cl_2$) gas 28 to the chamber arrangement 104, for example using the precursor delivery arrangement 102 (shown in FIG. 1). The chlorine ($Cl_2$) gas-containing fill 20 may be introduced in the chamber body 144 at a flow rate within which an MFC device metering the flow of the chlorine ($Cl_2$) gas to the chamber arrangement 104 is accurate, for example between about 50 standard cubic centimeters per minute and about 500 standard cubic centimeters per minute. The chlorine ($Cl_2$) gas-containing fill 20 may be introduced into the chamber body 144 while the either (or both) the isolation valve 114 (shown in FIG. 1) and the PCV 116 coupling the chamber body 144 to the exhaust source 106 (shown in FIG. 1) is closed, the interior 182 of the chamber body 144 thereby fluidly separated from one or more vacuum pump included in the exhaust source 106.

Introduction of the chlorine ($Cl_2$) gas-containing fill 20 into the chamber body 144 may be accomplished by intermixing the chlorine ($Cl_2$) gas 28 with nitrogen ($N_2$) gas. In this respect the chlorine ($Cl_2$) gas 28 from the chlorine ($Cl_2$) gas source 128 (shown in FIG. 2) may be intermixed with the nitrogen ($N_2$) gas 30 (shown in FIG. 2) from the nitrogen ($N_2$) gas source 130 (shown in FIG. 2) outside of the chamber body 144, and the intermixed chlorine ($Cl_2$) gas 28 and nitrogen ($N_2$) gas 30 communicated into the interior 182 of the chamber body 144 by the injection flange 146. As will be appreciated by those of skill in the art in view of the present disclosure, this enables diluting concentration of the chlorine ($Cl_2$) gas-containing fill 20 ex-situ in addition to limiting the aforementioned thermal affects potentially associated with other types if diluent gases, such as hydrogen ($H_2$) gas by way example.

Introduction of the chlorine ($Cl_2$) gas-containing fill 20 into the chamber body 144 may include increasing pressure within the chamber body 144 in certain examples of the present disclosure. In the respect it is contemplated that the pressure within the interior 182 of the chamber body 144 may be increased from a first pressure at the start of introduction of the chlorine ($Cl_2$) gas-containing fill 20, e.g., a pressure substantially equivalent to that within the chamber body 144 during removal of the substrate 2 (shown in FIG. 1) from the chamber body 144, to a second pressure greater than the first pressure at the conclusion of introduction of the chlorine ($Cl_2$) gas-containing fill 20 into the chamber body 144. In certain examples, introduction of the chlorine ($Cl_2$) gas-containing fill 20 may include increasing pressure within the interior of the chamber body 144 while the either (or both) of isolation valve 114 and the PCV 116 is closed. In this respect pressure within the chamber body 144 may be increased from within a range of between about 2 Torr and about 10 Torr to within a range that is between about 75 Torr and about 125 Torr, for example from about 5 Torr to about 100 Torr, during introducing of the chlorine ($Cl_2$) gas-containing fill 20 into the chamber body 144. Pressure change with the chamber body 144 may increase progressively during introduction of the chlorine ($Cl_2$) gas-containing fill 20, e.g., is a way corresponding to cumulative increase in mass flow of chlorine ($Cl_2$) gas provided to the chamber body 144, pressure increasing linearly with respect to time during the introduction of the chlorine ($Cl_2$) gas-containing fill 20.

Temperature of the chamber arrangement 104 may be maintained within a range where the chlorine ($Cl_2$) gas 28 introduced into the interior 182 of the chamber body 144 operates to etch silicon-containing accretions within the chamber body 144, e.g., the silicon-containing accretion 32 and the silicon-containing accretion 34, but does not decarbonize silicon carbide surfaces of structures within the interior 182 of the chamber body 144, e.g., one or more of the divider 154, the substrate support 156, and plurality of lift pins 194. In this respect it contemplated that the temperature of the transparent material 180 forming the chamber body 144 and the opaque material 190 forming the divider 154 and the substrate support 156 may be maintained between about 300 degrees Celsius and about 500 degrees Celsius while the chlorine ($Cl_2$) gas-containing fill 20 is resident within the chamber body 144. In this respect temperature of the transparent material 180 forming the chamber body 144 (e.g., as measured at the exterior surface of the upper wall by a pyrometer) may be maintained between about 250 degrees Celsius and about 400 degrees Celsius, for example between about 250 degrees Celsius and about 300 degrees Celsius, or between about 300 degrees Celsius and about 350 degrees Celsius, or even between about 350 degrees Celsius and about 400 degrees Celsius during etching of the silicon-containing accretion 32. Temperature of the opaque material 190 forming the substrate support 156 (e.g., as measured by a thermocouple arranged within the chamber body 144 and abutting the substrate support 156) may be maintained between about 350 degrees Celsius and about 550 degrees Celsius, for example between about 350 degrees Celsius and about 425 degrees Celsius, or between about 425 degrees Celsius and about 500 degrees Celsius, or even between about 500 degrees Celsius and about 575 degrees Celsius during etching of the silicon-containing accretion 34. As will be appreciated by those of skill in the art in view of the present disclosure, temperatures within these ranges avoid the need to increase temperature of the transparent material 180 and the opaque material 190 to temperatures required for hydrochloric (HCl) to remove silicon-containing accretions, e.g., 1000 degrees Celsius and higher, limiting time required for chamber cleaning by eliminating the need to heat and thereafter cool the transparent material 180 and the opaque material 190.

Temperature within the chamber arrangement 104 may be decreased during introduction of the chlorine ($Cl_2$) gas-containing fill 20 into the chamber body 144 relative to temperature during unloading of the substrate 2 from the chamber body 144. For example, temperature of the interior surface 107 (shown in FIG. 3) of the upper wall 168 (shown in FIG. 3) of the chamber body 144 may be decreased during introduction of the chlorine ($Cl_2$) gas-containing fill 20 into the chamber body 144 and etching of at least a portion of the silicon-containing accretion 32. Temperature of upper and lower surfaces of the substrate support 156 may be decreased during introduction of the chlorine ($Cl_2$) gas-containing fill 20 into the chamber body 144 and etching of at least a portion of the silicon-containing accretion 32. In certain examples, the substrate 2 may be unloaded from the chamber arrangement 104 while the chamber arrangement is greater than temperature at which cleaning is accomplished and lower than material layer deposition, for example between about 500 degrees Celsius and about 650 degrees Celsius.

It is contemplated that a temperature differential be maintained between the chamber body 144 and the substrate support 156 arranged within the chamber body 144 during introduction of the chlorine ($Cl_2$) gas-containing fill 20 and etching at least a portion of the silicon-containing accretion 32. For example, a temperature differential that is between about 140 degrees Celsius and about 175 degrees Celsius may be maintained between the chamber body 1444 and the substrate support 156 during introduction of the chlorine ($Cl_2$) gas-containing fill 20. In certain examples temperature of the chamber body 144 may be decreased to between about 275 degrees Celsius and about 400 degrees Celsius during introduction of the chlorine ($Cl_2$) gas-containing fill 20 and etching of silicon-containing accretion 32 with the chlorine ($Cl_2$) gas-containing fill 20 relative to the substrate unload temperature, and temperature of the substrate support 156 may be decreased to between about 575 degrees Celsius and about 400 degrees Celsius during introduction of the chlorine ($Cl_2$) gas-containing fill 20 and etching of at least a portion of the silicon-containing accretion 32 with the chlorine ($Cl_2$) gas-containing fill 20 relative to the substrate unload temperature. Toward this end the shaft purge provided to the gap between the tube member 164 and the shaft member 160 may be reduced (or cease) or be switched to a gas not reactive with chlorine ($Cl_2$) gas, such as from hydrogen ($H_2$) gas to nitrogen ($N_2$). Advantageously, maintaining a temperature differential within these ranges enables the chlorine ($Cl_2$) gas 28 to etch (and thereby remove) silicon-containing accretions on both quartz surfaces and silicon carbide surfaces while preventing decarbonization (and thereby damage) of exposed silicon carbide surfaces on structures within the interior 182 of the chamber body 144.

It is contemplated that the chlorine ($Cl_2$) gas 28 provided to the chamber arrangement 104 may fill the interior 182 of the chamber body 144 and circulated within the chamber body using a turbulent flow pattern 38 notwithstanding the laminar flow condition otherwise promoted by the uniform effective flow area of the chamber body 144 between the injection end 176 and the exhaust end 178 of the chamber body 144. In this respect at least a portion of the chlorine ($Cl_2$) gas 28 forming the chlorine ($Cl_2$) gas-containing fill 20 may be introduced into the chamber body 144 while the either (or both) the isolation valve 114 and PCV 116 is closed, at least a portion of the chlorine ($Cl_2$) gas 28 entering the chamber arrangement 104 during an interval when none of chlorine ($Cl_2$) gas 28 is communicated to the pressure control valve 116 (shown in FIG. 1). As will be appreciated by those of skill in the art in view of the present disclosure, introducing the chlorine ($Cl_2$) gas 28 into the chamber body 144 under the turbulent flow pattern 38 can improve efficacy of the chlorine ($Cl_2$) gas 28, and thereby cleaning cycle time, by reducing mean free path between chlorine molecules forming the chlorine ($Cl_2$) gas-containing fill 20.

In accordance with certain examples, the substrate support 156 may be rotated R about the rotation axis 192 within the chamber body 144 during etching of at least a portion of the silicon-containing accretion 32 while no substrate is seated on the substrate support 156. As will also be appreciated by those of skill in the art in view of the present disclosure, rotating R the substrate support 156 can introduce further turbulence into the chlorine ($Cl_2$) gas-containing fill 20, further improving efficacy of the cleaning as well as limiting residency time of chlorine ($Cl_2$) gas at the substrate support 156, limiting etching of the substrate support 156 by the chlorine ($Cl_2$) gas-containing fill 20.

Referring to FIG. 7, removal of the chlorine ($Cl_2$) gas-containing fill 20 and silicon-containing etchant products 40 may be accomplished by opening the either (or both) the isolation valve 114 and the PCV 116. Opening the either (or both) the isolation valve 114 and the PCV 116 restores fluid communication between the interior 182 of the chamber body 144 with the exhaust source 106. Restoration of fluid communication between the interior 182 of the chamber body 144 and the exhaust source 106 (shown in FIG. 1) in turn enables the exhaust source 106 to draw the remainder of the chlorine ($Cl_2$) gas-containing fill 20 remaining following etching of the silicon-containing accretion 32 (shown in FIG. 4) and the silicon-containing accretion 34 (shown in FIG. 4) as well the silicon-containing etchant products 40 resultant form the etching process from within the chamber body 144, the chamber arrangement 104 thereby ready for deposition of a subsequent material onto another substrate. As will be appreciated by those of skill in the art in view of the present disclosure, withdrawal of the residual chlorine ($Cl_2$) gas-containing fill 20 through the isolation valve 114 and the pressure control valve 116 (shown in FIG. 1) may also removes accreted silicon-containing material from either (or both) the isolation valve 114 and the PCV 116, as well as the exhaust conduit 112 (e.g., a system foreline), further improving reliability of the semiconductor processing system 100 (shown in FIG. 1).

With reference to FIGS. 8-12, the material layer deposition method 300 is shown according to an example of the present disclosure. As shown in FIG. 8, the method 300 includes flowing a silicon-containing material layer precursor through a chamber body, e.g., the first material layer precursor 16 (shown in FIG. 2) through the chamber body 144 (shown in FIG. 2), as shown with box 302. The method 300 also includes depositing a silicon-containing material layer onto the substrate, e.g., the material layer 4 (shown in FIG. 1) formed using the silicon-containing material layer precursor and forming a silicon-containing accretion within the chamber body, e.g., the silicon-containing accretion 32 (shown in FIG. 4), as shown with box 304 and box 306. It is contemplated that the method 300 may include flowing nitrogen ($N_2$) gas through the chamber body, e.g., the nitrogen ($N_2$) gas 30 (shown in FIG. 5), to purge the chamber body, and that the method additionally include introducing a chlorine ($Cl_2$) gas-containing fill in to the chamber body, e.g., the chlorine ($Cl_2$) gas-containing fill 20 (shown in FIG. 6), as shown with box 308 and box 310. It is also contemplated that the chlorine ($Cl_2$) gas-containing fill etch at least a portion of the silicon-containing accretion, and that residual chlorine ($Cl_2$) gas and a silicon-containing etchant product thereafter be removed from the chamber body, e.g., the residual chlorine ($Cl_2$) gas and silicon-containing etchant products 40 (shown in FIG. 7), as shown with box 312 and body 314. As shown with arrow 316, cleaning may be accomplished after each substrate processed within the chamber body, for example in a clean after each substrate processing mode of operation. As shown with box 318, cleaning may be accomplished after processing more than one substrate in the chamber body, such as in a multi-substrate processing mode of operation.

Figure 9:
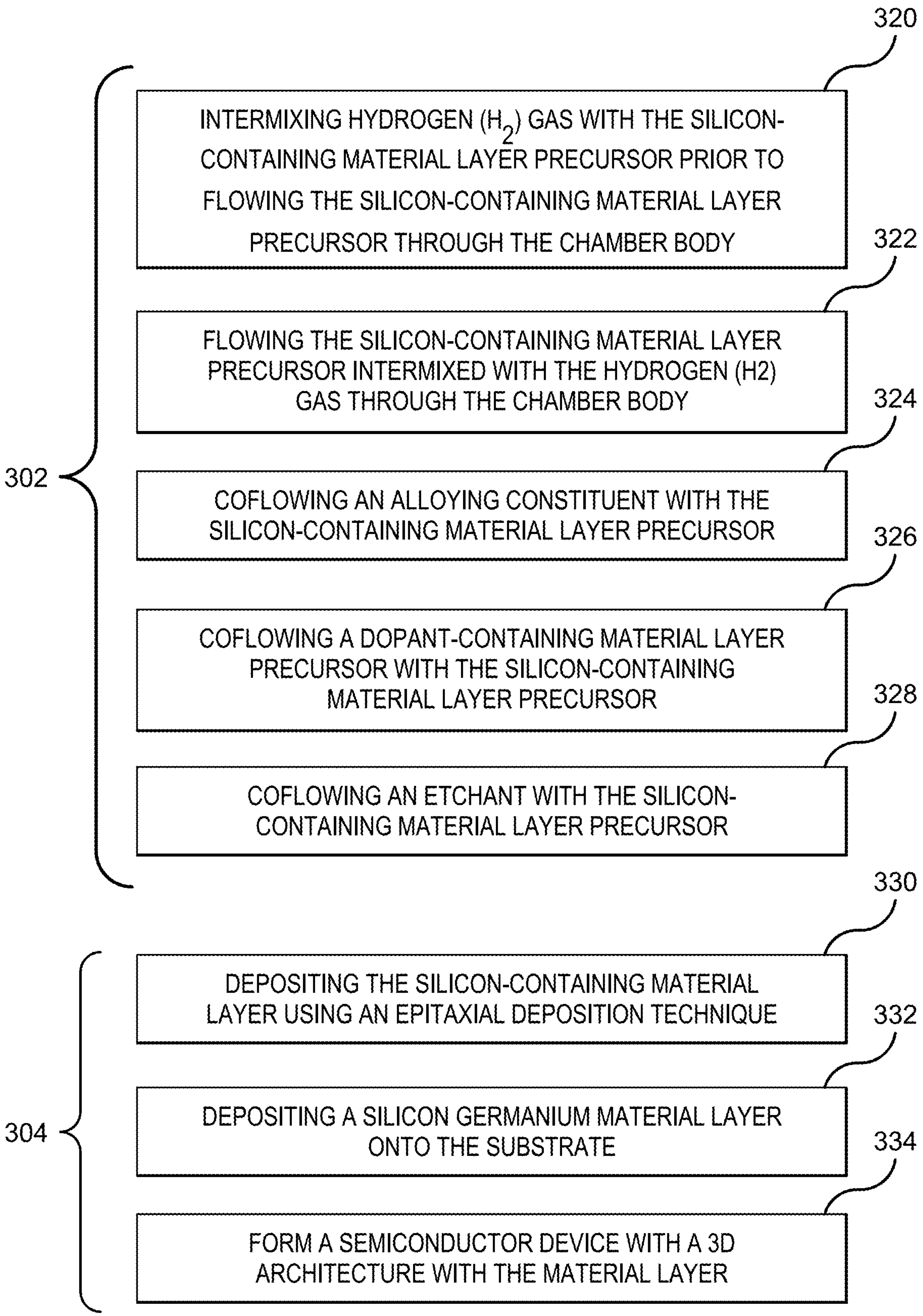

As shown in FIG. 9, flowing 302 the silicon-containing material layer precursor through the chamber body may include intermixing the silicon-containing material layer with a hydrogen ($H_2$) gas-containing carrier or diluent gas, e.g., the diluent/carrier gas 26 (shown in FIG. 2), and the providing the mixture of silicon-containing material layer precursor and hydrogen ($H_2$) gas to the chamber body, as shown with box 320. Flowing 302 the silicon-containing material layer precursor through the chamber body may include flowing the silicon-containing material layer through the chamber body under laminar flow conditions using a laminar flow pattern, e.g., the laminar flow pattern 36 (shown in FIG. 4), as shown with box 322. Flowing 302 the silicon-containing material layer through the chamber body may include co-flowing the silicon-containing material layer precursor through the chamber body with an etchant, e.g., the etchant 24 (shown in FIG. 2), as shown with box 324. In certain examples, flowing 302 the silicon-containing material layer through the chamber body may include coflowing an alloying constituent with the silicon-containing material layer precursor through the chamber body, e.g., the second material layer precursor 22 (shown in FIG. 2), as shown in with box 326. In this respect it is contemplated that the silicon-containing material layer precursor may be co-flowed with one or more of a germanium-containing material layer precursor and a dopant-containing material layer precursor, as shown with box 328. Non-limiting examples of suitable germanium-containing material layer precursors include germane ($GeH_4$). Non-limiting examples of suitable dopant-containing precursors include material layer precursors including p-type or n-type dopants such as arsenic (As), boron (B), and phosphorous (P).

Depositing 304 the silicon-containing material layer onto the substrate may include depositing the silicon-containing material using an epitaxial deposition technique, as shown with box 330. In this respect the material layer 4 may be epitaxial (e.g., single crystal) with respect a portion of the underlying substrate, as further shown by box 330. Depositing 304 the silicon-containing material layer onto the substrate may include depositing a silicon germanium layer onto the substrate, as shown with box 332. Depositing 304 the material layer onto the substrate may include depositing a plurality of layers onto the substrate, such as alternative layer pairs of silicon material layers and silicon germanium material layers, as also shown with box 332. In certain examples the material layer deposited onto the substrate may be used to from a semiconductor device with a three-dimensional (3D) architecture, as shown with box 334. Examples of 3D devices include 3D DRAM memory devices, finFET devices, and gate-all-around (GAA) devices.

Figure 10:
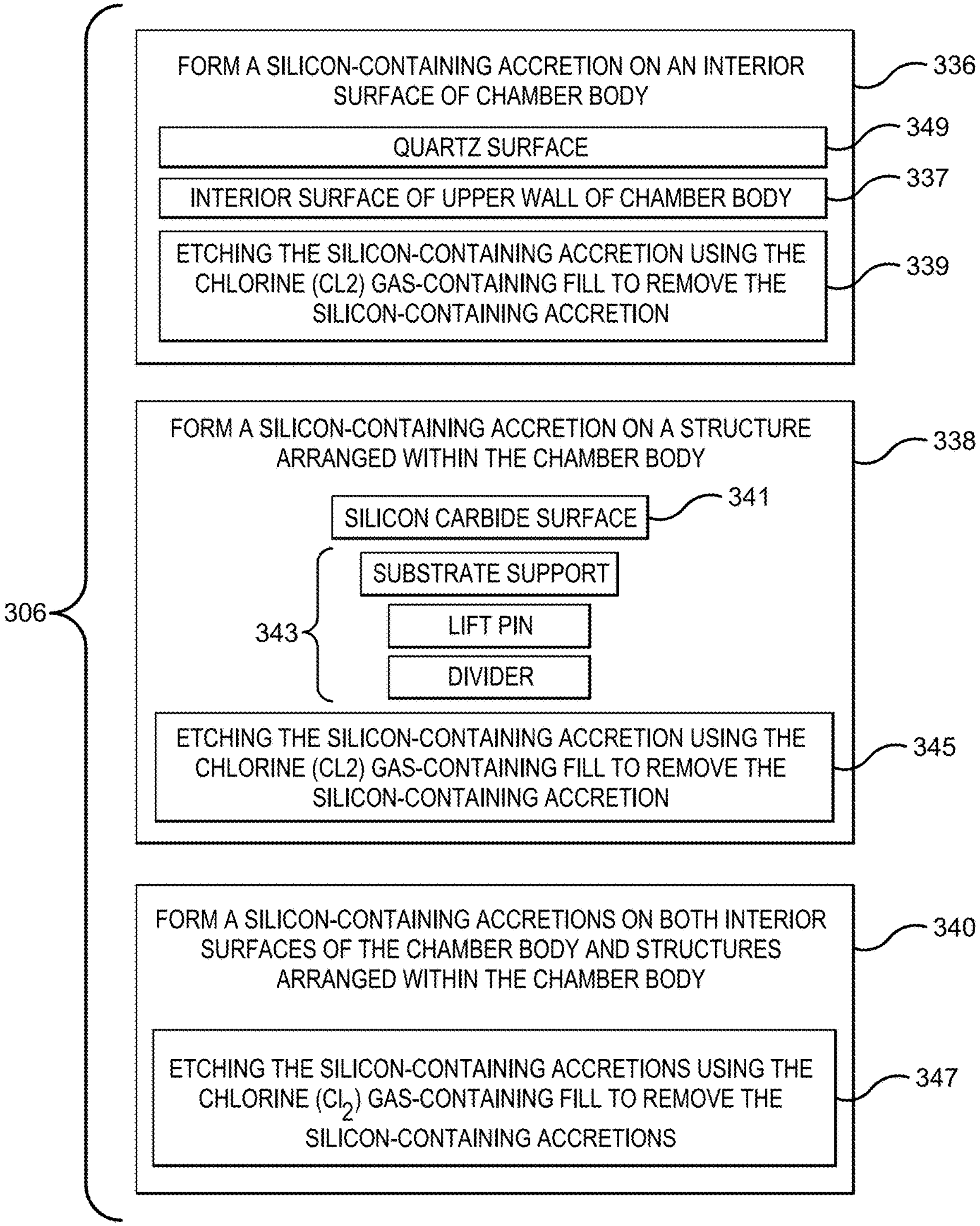

As shown in FIG. 10, forming 306 the silicon-containing accretion within the chamber body may include forming the silicon-containing accretion on an exposed quartz surface within the chamber body, as shown with box 336. In this respect it is contemplated that the silicon-containing accretion may be formed on an interior surface of one or more of the walls forming the chamber body, e.g., the upper wall 168 (shown in FIG. 3) of the chamber body, as also shown with box 336. For example, the silicon-containing accretion may be formed on a quartz surface within the chamber body, as shown with box 349. The silicon-containing accretion may be formed on an interior surface of the upper wall of the chamber body, as shown with box 337. It is contemplated that etching 312 (shown in FIG. 8) the silicon-containing accretion using the chlorine ($Cl_2$) gas-containing fill may include removing the silicon-containing accretion from the quartz surface within the chamber body, as shown with box 339.

Forming 306 the silicon-containing accretion within the chamber body may include forming the silicon-containing accretion on a structure arranged within the chamber body, as shown with box 338. In this respect the silicon-containing accretion may be formed on an exposed silicon carbide surface within the chamber body, shown with box 341. With respect to the example chamber arrangement shown and described herein, the silicon-containing accretion may be formed on one or more of the substrate support, the plurality of lift pins, and the divider, as shown with box 343. It is contemplated that etching 312 the silicon-containing accretion using the chlorine ($Cl_2$) gas-containing fill may include removing the silicon-containing accretion from the structure arranged within the interior of the chamber body, as shown with box 345. It is contemplated that the silicon-containing accretions may be formed on both exposed quartz surface and structures supported within the chamber body, and that etching 312 the chamber body include removing the accretions from both quartz surfaces and structures supported within the interior of the chamber body, as shown with box 340 and with box 347. It is further contemplated that forming the silicon-containing accretion may be formed (at least in part) during the same time interval during which the silicon-containing layer is deposited onto the substrate, as shown with box 340.

Figure 11:
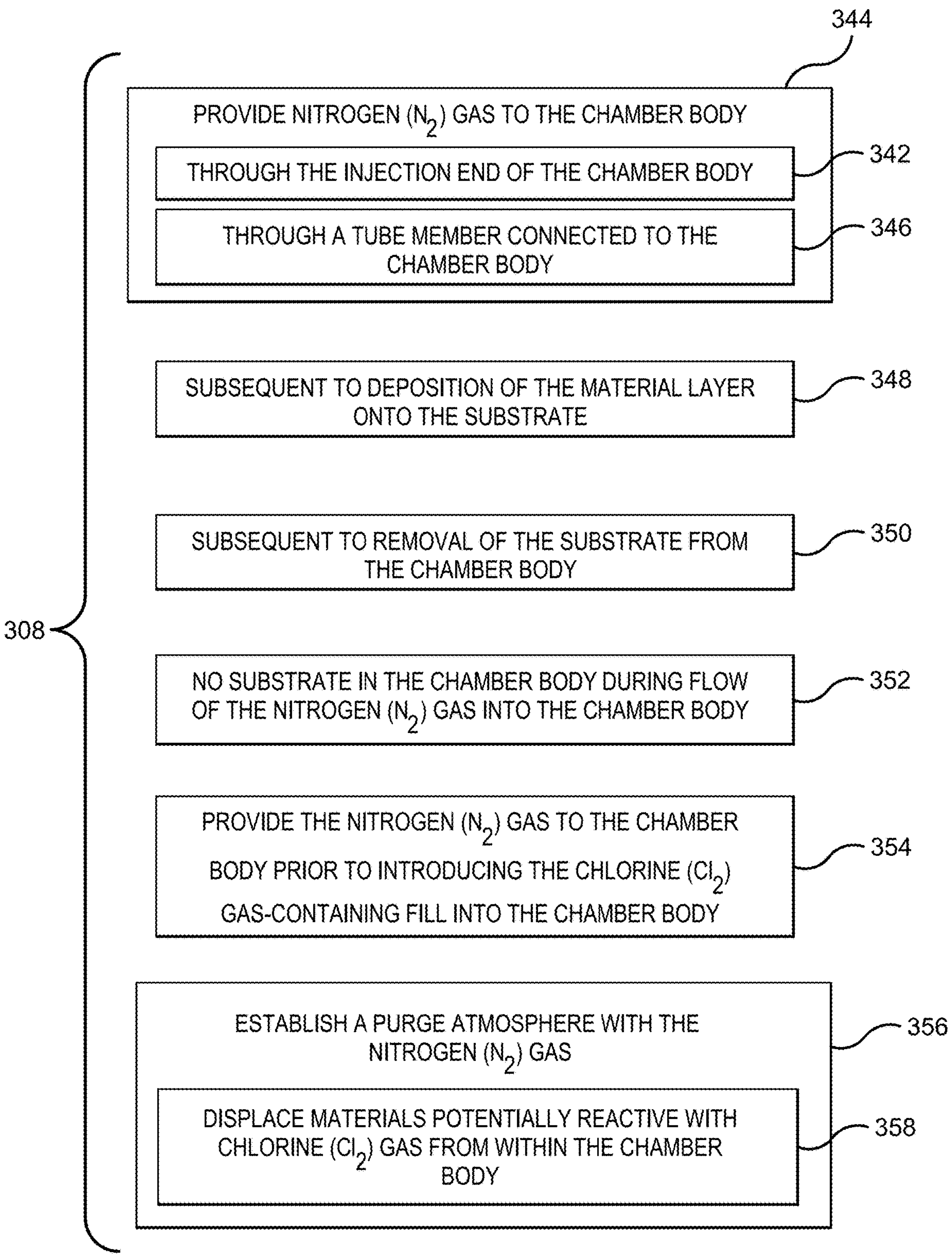

As shown in FIG. 11, introducing 308 the nitrogen ($N_2$) gas in the chamber body may include providing the nitrogen ($N_2$) to the chamber body from a nitrogen source, e.g., the nitrogen ($N_2$) gas source 130 (shown in FIG. 2), as shown with box 342. The nitrogen ($N_2$) gas may be introduced into the chamber body through an injection end of the chamber body, e.g., the injection end 176 (shown in FIG. 3) of the chamber body, as shown with box 344. The nitrogen ($N_2$) gas may be introduced in the chamber body through a tube member connected to the chamber body, e.g., the tube member 164 (shown in FIG. 3), as shown with box 346. The nitrogen ($N_2$) gas may be introduced into the chamber body through both the injection end of the chamber body and the tube member, as shown with box 344 and box 346, and thereafter flow though the chamber body to the exhaust arrangement. The nitrogen ($N_2$) gas may be introduced into the chamber body subsequent to deposition of the material layer onto the substrate, as shown with box 348. The nitrogen ($N_2$) gas may be introduced into the chamber body subsequent to removal of the substrate from the chamber body, as shown with box 350.

It is contemplated that the no substrate be disposed within the chamber body during flow the nitrogen ($N_2$) gas through the chamber body, as shown with box 352. It is also contemplated that the nitrogen ($N_2$) gas be provided to the chamber body prior to introducing the chlorine ($Cl_2$) gas-containing fill into the chamber body, as shown with box 354. It is also contemplated that the nitrogen ($N_2$) gas establish a purge atmosphere (e.g., an atmosphere devoid of material potentially reactive with chlorine ($Cl_2$) gas) within the chamber body by displacing residual silicon-containing material layer precursor and diluent/carrier gas from within the interior of the chamber body, as shown with box 356 and box 358. As will be appreciated by those of skill in the art in view of the present disclosure, displacing residual materials potentially reactive with chlorine ($Cl_2$) gas such as hydrogen ($H_2$) gas resident within the chamber body prior to introducing the chlorine ($Cl_2$) gas-containing fill into the chamber body can limiting thermal affects potentially associated with the residual hydrogen ($H_2$) gas, for example due to exothermic reaction of residual hydrogen ($H_2$) gas with chlorine ($Cl_2$) gas provided to the chamber body.

Figure 12:
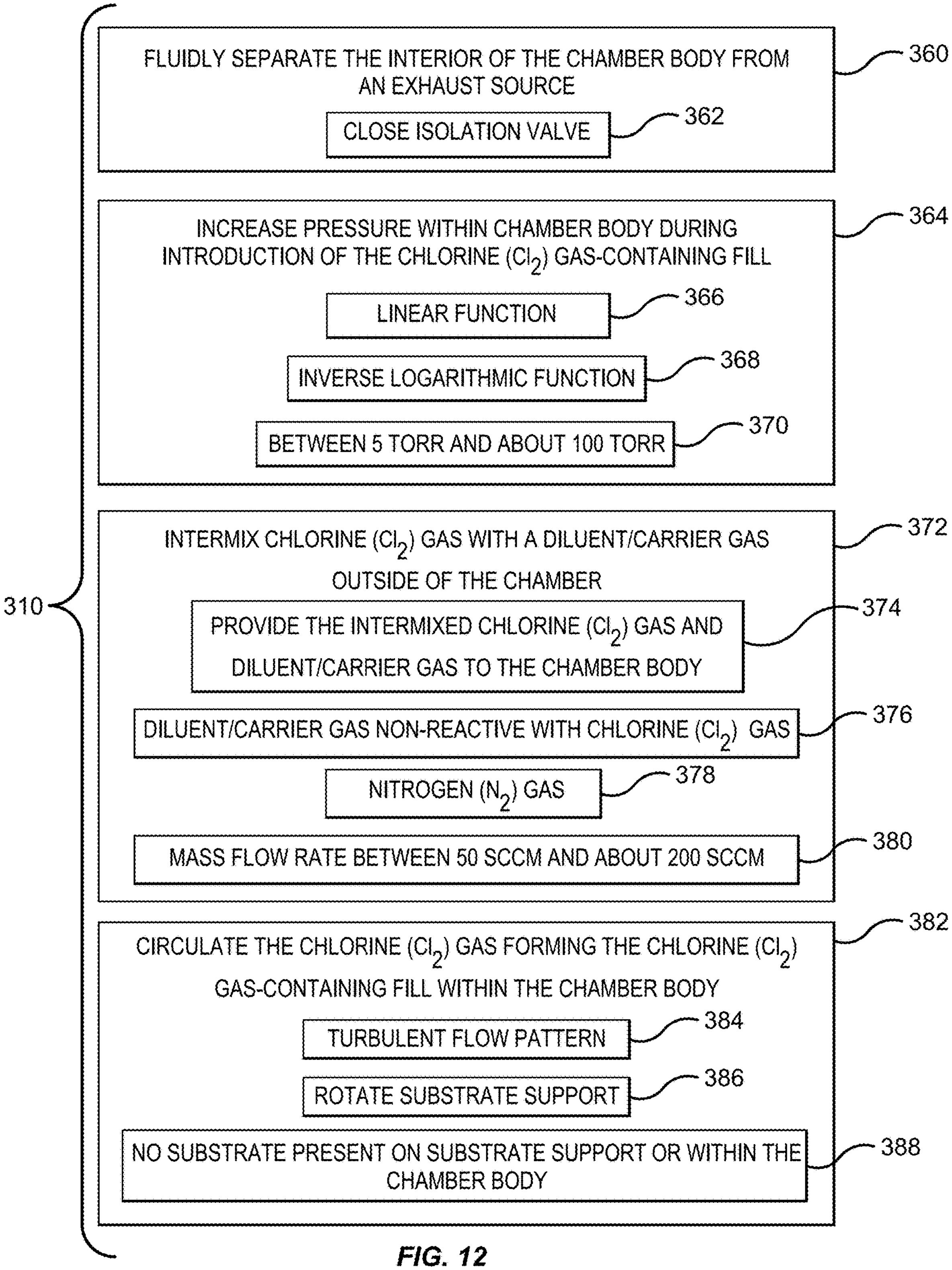

As shown in FIG. 12, introducing 310 the chlorine ($Cl_2$) gas-containing fill into the chamber body may include fluidly separating the interior of chamber body from an exhaust source, e.g., the exhaust source 106 (shown in FIG. 1), as shown with box 360. The chlorine ($Cl_2$) gas-containing fill may be introduced into the interior of the chamber body while the chamber body is fluidly separated from the exhaust source, as also shown with box 360. Fluid separation may be accomplished by closing either (or both) an isolation valve coupling the chamber body to the exhaust source through a pressure control valve and the pressure control valve and the pressure control valve, e.g., the isolation valve 114 (shown in FIG. 3) coupling the chamber body to the exhaust source 106 through the pressure control valve 116 (shown in FIG. 3), as also shown with box 362. Fluid separation may include fluidly separating the chamber body from the pressure control valve operatively associated with the chamber body and configured to maintain a predetermined pressure within the interior of the chamber body, as also shown with box 362.

Introducing 310 the chlorine ($Cl_2$) gas-containing fill into the chamber body may include increasing pressure within the interior of the chamber body during the course of the introduction, as shown with box 364. In this respect pressure within the chamber body may increase from a first pressure at a start of introduction of the chlorine ($Cl_2$) gas-containing fill into the chamber body to a second pressure at a conclusion of introducing the chlorine ($Cl_2$) gas-containing fill into the chamber body, the second pressure greater than the first pressure, as also shown with box 364. Pressure within the chamber body may be increased in a graduated way during introduction of the chlorine ($Cl_2$) gas-containing fill into the interior of the chamber body. In certain examples, pressure within the chamber body may increase according to a substantially linear function between the start of the introduction of the chlorine ($Cl_2$) gas-containing fill and the conclusion of introduction of the chlorine ($Cl_2$) gas-containing fill, as shown with box 366. In accordance with certain examples, pressure within the chamber body may increase according to a substantially inverse logarithmic function between the start of the introduction of the chlorine ($Cl_2$) gas-containing fill and the conclusion of introduction of the chlorine ($Cl_2$) gas-containing fill, as shown with box 368. In certain examples pressure within the chamber body may increase by between about 5 Torr and about 100 Torr, as shown with box 370. For example, pressure may increase between the start of the introduction and the conclusion of the introduction by between about 5 Torr and about 25 Torr, or between about 25 Torr and about 50 Torr, or between about 50 Torr and about 75 Torr, or even between about 75 Torr and about 100 Torr. Advantageously, increasing pressure to within these ranges enables cleaning components downstream of the isolation 114, e.g., the pressure control valve 112, the pressure increase with the chamber increasing residency of chlorine ($Cl_2$) within the exhaust conduit due to the relatively small effective flow area relative to the chamber body 144.

Introducing 310 the chlorine ($Cl_2$) gas-containing fill into the chamber body may include intermixing chlorine ($Cl_2$) gas, e.g., the chlorine ($Cl_2$) gas 28 (shown in FIG. 2), with a diluent/carrier gas, as shown with box 372. The chlorine ($Cl_2$) gas may be intermixed with the diluent/carrier gas ex-situ (e.g., outside of the chamber body), and the mixture of chlorine ($Cl_2$) and diluent/carrier gas provided to the chamber body, as also shown with 374. It is contemplated that the diluent/carrier gas be different than the diluent/carrier gas intermixed with the silicon-containing material layer precursor, e.g., the diluent/carrier gas 26 (shown in FIG. 2), and in this respect the diluent/carrier gas that does not react with chlorine ($Cl_2$) gas, as shown with box 376. In this respect the chlorine ($Cl_2$) gas may be intermixed with nitrogen ($N_2$) gas, e.g., nitrogen ($N_2$) gas 30 (shown in FIG. 2), as shown with box 378. As will be appreciated by those of skill in the art in view of the present disclosure, intermixing the chlorine ($Cl_2$) gas with nitrogen ($N_2$) gas ex-situ limits (or eliminates) the tendency that chlorine ($Cl_2$) gas could otherwise have to etch silicon carbide surfaces located proximate the injection end of the chamber body, such as the divider 154 (shown in FIG. 3).

In certain examples, the chlorine ($Cl_2$) gas (or the mixture of chlorine ($Cl_2$) gas and the diluent/carrier gas) may be introduced into the chamber body at a mass flow rate that is between about 50 standard cubic centimeters per minute (SCCM) and about 1000 SCCM, as shown with box 380. For example, the chlorine ($Cl_2$) gas may be provided to the chamber body at a flow rate that is between about 50 SCCM and about 200 SCCM, or between about 200 SCCM and about 400 SCCM, or even between about 400 SCCM and about 1000 SCCM. It is contemplated that the chlorine ($Cl_2$) gas may be introduced into the chamber body while the either (or both) the isolation valve and the pressure control valve coupling the chamber body to the exhaust source is closed, as also shown with box 380. It is also contemplated that mass flow rate of chlorine ($Cl_2$) gas provided to the chamber body may be substantially constant during introduction of the chlorine ($Cl_2$) gas-containing fill into the chamber body and remain within the scope of the present disclosure. Advantageously, flow rates within these ranges can provide sufficient chlorine ($Cl_2$) gas mass within the chamber body during the limited time period available for cleaning while not requiring upgrade of the abatement apparatus employed in chamber arrangements configured to employ etchants like hydrochloric (HCl) acid during material layer deposition.

Introducing 310 the chlorine ($Cl_2$) gas-containing fill into the chamber body may include circulating the chlorine ($Cl_2$) gas forming the chlorine ($Cl_2$) gas-containing fill within the interior of the chamber body, as shown with box 382. Circulation may be accomplished using a turbulent flow pattern, e.g., the turbulent flow pattern 38 (shown in FIG. 6), as shown with box 384. In this respect it is contemplated that a normally laminar flow pattern encouraged by a substantially uniform effective flow area defined between the injection end and the exhaust of the upper chamber be disturbed by closure of the either (or both) the isolation valve and the pressure control valve, and that the turbulent flow pattern circulate the chlorine ($Cl_2$) gas throughout the interior of the chamber body. As will be appreciated by those of skill in the art in view of the present disclosure, this increases the effective mean path for the molecules of the chlorine ($Cl_2$) gas introduced into the chamber body to the exhaust end of the chamber body, increasing efficacy of the cleaning and/or limiting total mass of chlorine ($Cl_2$) gas required for cleaning by diving the chlorine ($Cl_2$) gas to recesses less accessible or inaccessible (and thereby prone to silicon-containing accretion accumulation) when laminar flow conditions exist within the chamber body.

In certain examples a substrate support arranged within the chamber body may be rotated during the introduction of the chlorine ($Cl_2$) gas-containing fill and/or while the chlorine ($Cl_2$) gas-containing fill resides within the chamber body, e.g., the substrate support 156 (shown in FIG. 3), contributing to (or causing) the aforementioned turbulent flow pattern, as shown with box 386. In accordance with certain examples, the substrate support may be rotated during the etching of the silicon-containing accretion, as also shown with box 386. It is contemplated that substrate may be seated on the substrate support during rotation of the substrate support, further promoting turbulent flow of the chlorine ($Cl_2$) gas-containing fill within the chamber body using with non-planar shape of the upper surface of the substrate support, for example subsequent to cessation of flow of chlorine ($Cl_2$) gas into the chamber body and prior to opening the either (or both) isolation valve and the pressure control valve, as further shown with box 388.

Figure 13:
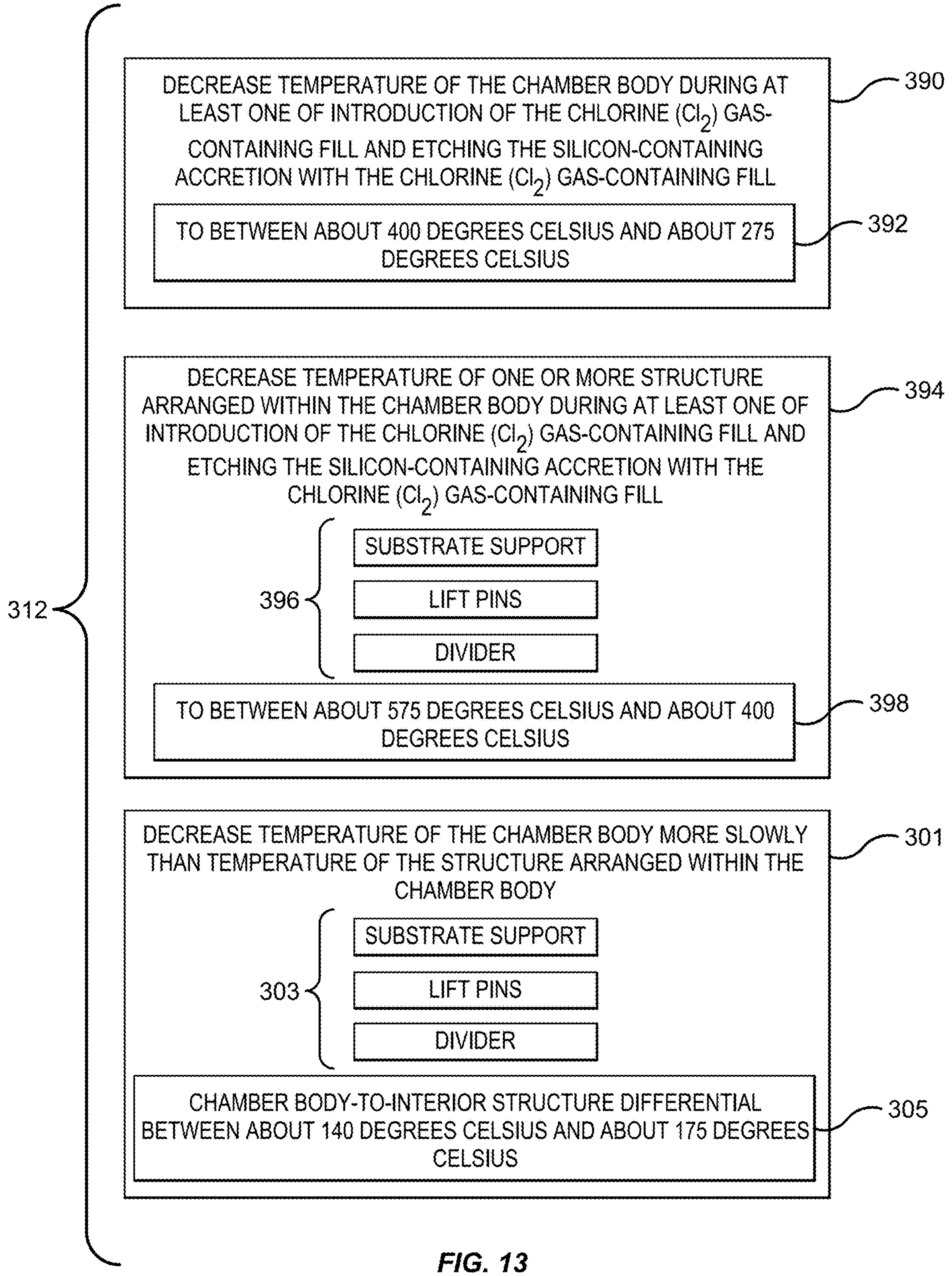

As shown in FIG. 13, etching 312 the silicon-containing accretion using the chlorine ($Cl_2$) gas-containing fill may include decreasing temperature of the chamber body during at least one of the introduction of the chlorine ($Cl_2$) gas-containing fill into the chamber body and the etching the silicon-containing accretion with the chlorine ($Cl_2$) gas-containing fill, as shown with box 390. In this respect temperature of the chamber body (e.g., the transparent material forming the chamber body) may be decreased to between about 400 degrees Celsius and about 275 degrees Celsius during introduction of the chlorine ($Cl_2$) gas-containing fill and the etching of the silicon-containing accretion using the chlorine ($Cl_2$) gas-containing fill, as shown with box 392. For example, temperature of the chamber body may be decreased to between about 400 degrees Celsius and about 350 degrees Celsius, or between about 350 degrees Celsius and about 300 degrees Celsius, or even between about 300 degrees Celsius and about 275 degrees Celsius. Advantageously, decreasing temperature of the chamber body to within these ranges enables the chlorine ($Cl_2$) gas forming the chlorine ($Cl_2$) gas-containing fill to etch (and thereby remove) silicon-containing accretions without etching the transparent material forming the chamber body, such as quartz by way of example.

Etching 312 the silicon-containing accretion using the chlorine ($Cl_2$) gas-containing fill may include decreasing temperature of one more structure arranged within the interior of the chamber during at least one of the introduction of the chlorine ($Cl_2$) gas-containing fill into the chamber body and the etching the silicon-containing accretion with the chlorine ($Cl_2$) gas-containing fill, as shown with box 394. In this respect temperature of one or more of the substrate support, the divider, and/or the plurality of lift pins arranged within the chamber body (e.g., temperature of the opaque material forming one or more of the aforementioned structures) may be decreased to between about 575 degrees Celsius and about 400 degrees Celsius during the introduction of the chlorine ($Cl_2$) gas-containing fill and/or the etching of the silicon-containing accretion using the chlorine ($Cl_2$) gas-containing fill, as shown with bracket 398. For example, temperature of the chamber body may be decreased to between about 575 degrees Celsius and about 525 degrees Celsius, or between about 525 degrees Celsius and about 450 degrees Celsius, or even between about 450 degrees Celsius and about 400 degrees Celsius, as also shown with box 398. Advantageously, decreasing temperature of structures arranged within the chamber body—and maintaining temperature of structures within this range—may limit (or eliminate) the tendency of chlorine ($Cl_2$) gas to otherwise etch the opaque material forming structures without impairing the ability of the chlorine ($Cl_2$) gas to etch silicon-containing accretions within the chamber body, such a structures from bulk silicon carbide or having silicon carbide coatings.

Etching 312 the silicon-containing accretion using the chlorine ($Cl_2$) gas-containing fill may include decreasing temperature of the chamber body (e.g., temperature of the interior surface of the upper wall of the chamber body) more slowly than the rate at which temperature of structures arranged within the interior of the chamber body is decreased, as shown with box 301. For example, temperature of the substrate support and/or the plurality of lift pins slidably received within the substrate support may be decreased more slowly than temperature of the substrate support arranged within the chamber body to limit etching of silicon carbide forming either (or both) the substrate support and the lift pins, as shown with box 303. Temperature of the chamber body may be decreased more slowly than temperature of the divider arranged within the chamber body to limit etching of the silicon carbide forming the divider, as shown with box 303. Magnitude of the temperature change may be accomplished using either (or both) an upper lamp array supported above the chamber body and/or a lower lamp array supported below the chamber body, e.g., the upper heater element array 150 (shown in FIG. 3) and/or the lower heater element array 152 (shown in FIG. 3). For example, power applied to either (or both) the upper lamp array and the lower lamp array may be dropped (e.g., to about 5% of nominal) to 'free-fall' temperature of the internal structures arranged within the interior of the chamber body than the chamber body, exploiting the emissivity characteristics of the opaque material forming the structures in relation to the transparent material forming the chamber body to establish a predetermined temperature differential range during the time interval within the chlorine ($Cl_2$) gas-containing fill is impounded within the chamber body by closure of the either r (or both) the isolation valve, and the pressure control valve.

In certain examples of the present disclosure etching 312 the silicon-containing accretion may using the chlorine ($Cl_2$) gas-containing fill may include maintaining a predetermined temperature differential between the chamber body and structures arranged within the interior of the chamber body, as shown with box 305. In this respect a temperature differential may be maintained between that the chamber body and structures arranged within the interior of the chamber body that is between about 140 degrees Celsius and about 175 degrees Celsius during introduction of the chlorine ($Cl_2$) gas-containing fill and/or etching of silicon-containing accretion using the chlorine ($Cl_2$) gas-containing fill, as also shown with box 305. For example, a temperature differential between about 140 degrees Celsius and about 150 degrees Celsius, or between about 150 degrees Celsius and about 160 degrees Celsius, or even between about 160 degrees Celsius and about 175 degrees Celsius may be maintained between the chamber body and the structures arranged within the interior of the chamber body such as the substrate support, as also further shown with box 305. Advantageously, such temperature differentials can ensure both efficacy of the chlorine ($Cl_2$) gas contained within the chlorine ($Cl_2$) gas-containing fill in etching silicon-containing accretions within the chamber body while limiting (or eliminating) etching of exposed silicon carbide surfaces within the interior of the chamber body.

Figure 14:
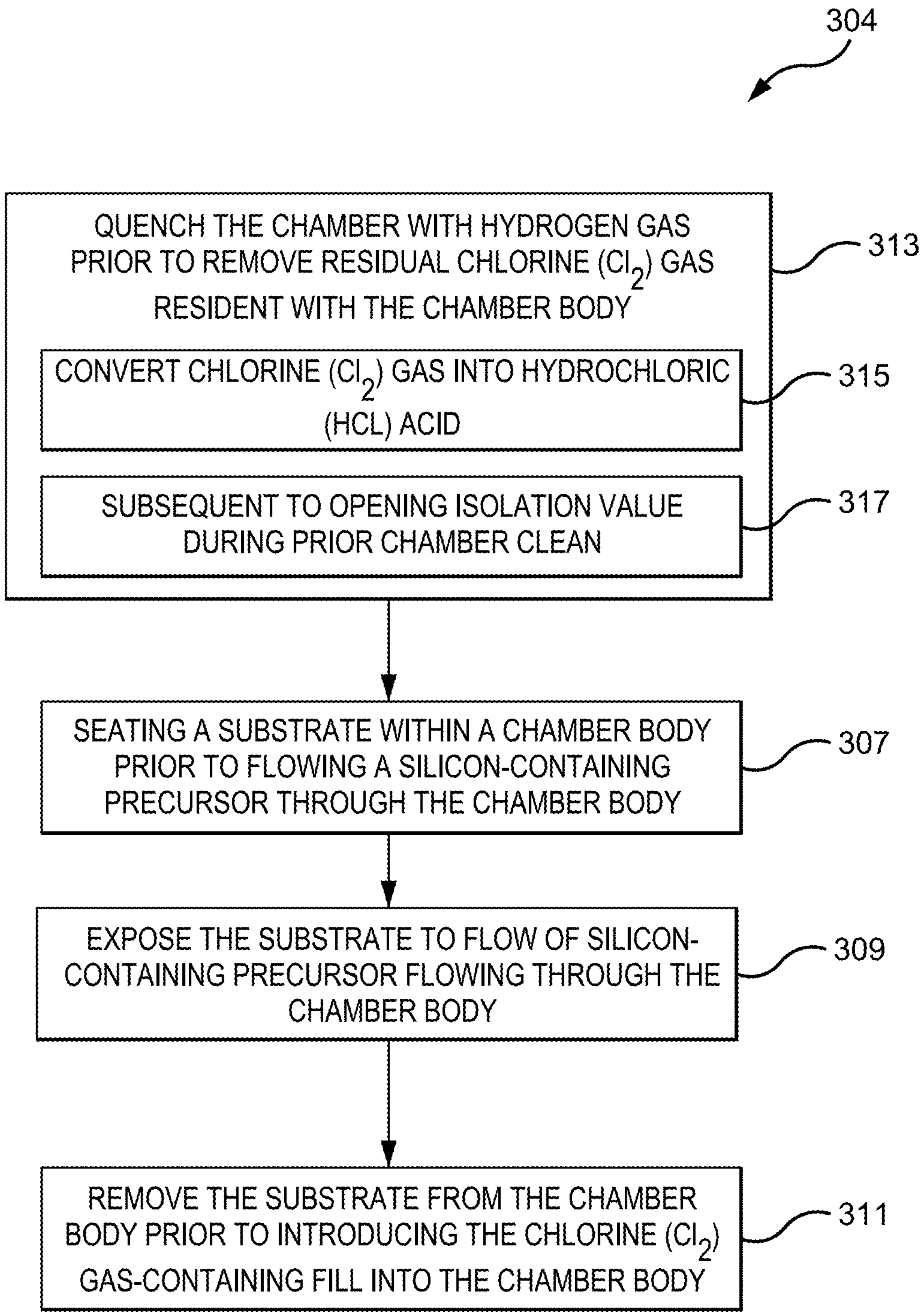

As shown in FIG. 14, depositing 304 the material layer onto the substrate may include seating a substrate within the chamber body prior to flowing the silicon-containing material layer precursor through the chamber body, as shown with box 307. The substrate may then be exposed to the silicon-containing material layer precursor as the silicon-containing material layer precursor flows through the chamber body, such as during flow through the chamber body according to a laminar flow pattern, as shown within box 309. It is contemplated that a silicon-containing material layer be deposited onto the substrate using the silicon-containing material layer precursor, and that the substrate thereafter be removed from the chamber body prior to introducing the chlorine ($Cl_2$) gas-containing fill, as shown with box 311. It is also contemplated that deposition and/or seating may be preceded by an etchant quenching operation, as shown with box 315. In this respect it is contemplated that hydrogen ($H_2$) gas be flowed into the chamber body subsequent to opening of the either (or both) the isolation valve and the pressure control valve following cleaning and prior to seating the substrate in the chamber body, for example to convert residual chlorine ($Cl_2$) gas resident within the chamber body into hydrochloric (HCl) acid, as shown with box 315 and with box 317. Advantageously, this prevents etching of the substrate by residual chlorine ($Cl_2$) gas resident within the chamber body following cleaning as hydrochloric (HCl) acid is inactive at typical substrate loading temperatures whereas chlorine ($Cl_2$) gas may be active at such loading temperatures.

In certain examples a shaft purge may be provided to a shaft member connected to the chamber body during deposition of the material layer onto the substrate, e.g., to the tube member 164 (shown in FIG. 3), as shown with box 315. In accordance with certain examples, the shaft purge may include hydrogen ($H_2$) gas, and composition of the shaft purge may be switched from hydrogen ($H_2$) gas to nitrogen ($N_2$) gas prior to the introduction of the chlorine ($Cl_2$) gas-containing purge into the chamber body, as shown with box 317. As will be appreciated by those of skill in art in view of the present disclosure, switching the shaft purge from hydrogen ($H_2$) gas to nitrogen ($N_2$) gas can limit thermal effects that residual hydrogen ($H_2$) gas captive within the tube member could otherwise have on temperature control within the chamber body during removal of silicon-containing accretions from within the chamber body. In certain examples, mass flow rate of the shaft purge may be reduced (or cease entirely) subsequent to introduction of the chlorine ($Cl_2$) gas-containing purge into the chamber body.

Material layers such as silicon-containing material layers formed using epitaxial techniques may be deposited onto substrates by supporting the substrate within a chamber, heating the substrate to a desired material layer deposition temperature, and exposing the substrate to a desired material layer deposition temperature under environmental conditions selected to cause a material layer to deposit onto the substrate. Once the material develops desired properties, for example a desired thickness or electrical property, the substrate may be removed from the chamber and sent on for further processing, as appropriate for the semiconductor device being fabricated. In some material layer deposition operations, accretions may form within the chamber employed for the deposition operation, such as when material layer precursor and/or reaction products condense on interior surfaces of the chamber employed for the material layer deposition operation and/or on structures located within the chamber, such as the substrate support employed to support the substrate and/or within mechanical clearances defined between mechanical components movable relative to one another with the chamber, such between lift pins slidably received within the substrate support and the substrate support seating the substrate during the material layer deposition operation.

Various countermeasures exist for managing accretion development within chambers. For example, in some deposition operations, the chamber may be periodically cleaned to remove accreted material between material layer deposition operations. Cleaning may be accomplished by heating the chamber to relatively high temperature, for example to about 1000 degrees Celsius, and hydrochloric (HCl) acid and a hydrogen ($H_2$) gas carrier provided to the chamber, the remove accreted material from within the chamber. While generally satisfactory for its intended purpose, such chamber cleans may limit throughput of the chamber due to the time required for the hydrochloric (HCl) flowing through the chamber to remove the accreted material from within the chamber. Moreover, because the hydrochloric (HCl) is flowed through the chamber, residency time is limited, and relatively large amounts of hydrochloric (HCl) may be required relative to the amount of hydrochloric (HCl) acid that reacts with the material forming the accretion, prolonging the time required for the cleaning the chamber and increasing cost of ownership due to the volume of unreacted hydrochloric (HCl) acid issued by the chamber.

In examples described herein chlorine ($Cl_2$) gas is employed to remove material accretions from interior surfaces and structures within chambers employed for material layer deposition. In accordance with certain examples, the cleaning is accomplished at relatively low temperature, for example at chamber temperatures between about 400 degrees Celsius and about 490 degrees Celsius. It is contemplated that the chamber body may be fluidly separated from the exhaust source and vacuum pump employed to maintain reduced pressure within the chamber body during material layer deposition, for example between about 3 Torr and about 10 Torr, by closing either (or both) an isolation valve and pressure control valve coupling the chamber body to the exhaust source and/or vacuum pump, distributing the chlorine ($Cl_2$) gas within the chamber by increasing the mean free path to reach the exhaust end of the chamber body. It is also contemplated that the chamber body may be purged with nitrogen prior to introduction of the chlorine ($Cl_2$) gas-containing fill into the chamber body and after removal of the chlorine ($Cl_2$) gas-containing fill and etchant products from the chamber, and foreline of the reactor additionally cleaned using the chlorine ($Cl_2$) gas-containing fill.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

The invention claimed is:

1. A material layer deposition method, comprising:

flowing a silicon-containing material layer precursor through a chamber body;

forming a silicon-containing accretion upon an interior surface of an upper wall of the chamber body;

introducing a chlorine ($Cl_2$) gas-containing fill into the chamber body, wherein the chlorine (Cl2) gas-containing fill is impounded within the chamber body by fluidly separating the chamber body from an exhaust source;

etching at least a portion of the silicon-containing accretion using the impounded chlorine ($Cl_2$) gas-containing fill; and removing the chlorine ($Cl_2$) gas-containing fill and a silicon-containing etchant product from the chamber body via the exhaust source;

wherein the chamber body comprises a substrate support with a silicon carbide coating;

wherein a temperature of the chamber body and a temperature of the substrate support are decreased during the introducing of the chlorine ($Cl_2$) gas-containing fill and the etching; and wherein the temperature of the chamber body is decreased more slowly than the temperature of the substrate support to limit etching of the silicon carbide coating by the chlorine ($Cl_2$) gas-containing fill.

2. The method of claim 1, further comprising:

supporting a substrate within the chamber body prior to the flowing of the silicon-containing material layer precursor through the chamber body;

exposing the substrate to the silicon-containing material layer precursor during the flowing of the silicon-containing material layer precursor through the chamber body;

depositing a silicon-containing material layer onto the substrate using the silicon-containing material layer precursor; and removing the substrate from the chamber body prior to the introducing of the chlorine ($Cl_2$) gas-containing fill into the chamber body.

3. The method of claim 1, further comprising:

intermixing hydrogen ($H_2$) gas with the silicon-containing material layer precursor prior to the flowing of the silicon-containing material layer precursor through the chamber body; and wherein the flowing of the silicon-containing material layer precursor through the chamber body comprises flowing the silicon-containing material layer precursor intermixed with the hydrogen ($H_2$) gas through the chamber body.

4. The method of claim 1, wherein pressure within the chamber body increases from about 5 Torr to about 100 Torr during the introducing of the chlorine ($Cl_2$) gas-containing fill.

5. The method of claim 1, wherein the forming of the silicon-containing accretion comprises forming the silicon-containing accretion on a quartz surface within the chamber body, and wherein the etching of at least the portion of the silicon-containing accretion comprises removing the silicon-containing accretion from the quartz surface within the chamber body.

6. The method of claim 1, wherein the forming of the silicon-containing accretion comprises forming the silicon-containing accretion on the silicon carbide coating, and wherein the etching of at least the portion of the silicon-containing accretion comprises removing the silicon-containing accretion from the silicon carbide coating.

7. The method of claim 1, wherein the introducing of the chlorine ($Cl_2$) gas-containing fill into the chamber body comprises:

flowing nitrogen ($N_2$) gas through an interior of the chamber body;

purging the interior of the chamber body with the nitrogen ($N_2$) gas;

fluidly separating the interior of the chamber body from the exhaust source by closing an exhaust valve or a pressure release valve that couples the exhaust source to the chamber body; and introducing the chlorine ($Cl_2$) gas-containing fill into the interior of the chamber body while the chamber body is fluidly separated from the exhaust source.

8. The method of claim 1, wherein the introducing of the chlorine ($Cl_2$) gas-containing fill into the chamber body comprises increasing pressure within an interior of the chamber body from a first pressure at a start of introducing the chlorine ($Cl_2$) gas-containing fill to a second pressure at a conclusion of introducing the chlorine ($Cl_2$) gas-containing fill.

9. The method of claim 1, wherein the flowing of the silicon-containing material layer precursor through the chamber body comprises flowing the silicon-containing material layer precursor through an interior of the chamber body using a laminar flow pattern, and wherein the introducing of the chlorine ($Cl_2$) gas-containing fill into the chamber body comprises circulating the chlorine ($Cl_2$) gas-containing fill within the chamber body using a turbulent flow pattern.

10. The method of claim 1, further comprising rotating the substrate support during the etching of at least the portion of the silicon-containing accretion with the chlorine ($Cl_2$) gas-containing fill, wherein no substrate is seated on the substrate support during rotation of the substrate support.

11. The method of claim 1, further comprising maintaining a temperature difference of between about 140 degrees Celsius and about 175 degrees Celsius between the chamber body and the substrate support during the introducing of the chlorine ($Cl_2$) gas-containing fill into the chamber body and the etching of at least the portion of the silicon-containing accretion using the chlorine ($Cl_2$) gas-containing fill.

12. The method of claim 1, wherein the temperature of the chamber body is decreased to between about 275 degrees Celsius and about 400 degrees Celsius during the introducing of the chlorine ($Cl_2$) gas-containing fill into the chamber body and the etching of at least the portion of the silicon-containing accretion with the chlorine ($Cl_2$) gas-containing fill.

13. The method of claim 1, wherein the temperature of the substrate support is decreased to between about 400 degrees Celsius and about 575 degrees Celsius during the introducing of the chlorine ($Cl_2$) gas-containing fill into the chamber body and the etching of at least the portion of the silicon-containing accretion using the chlorine ($Cl_2$) gas-containing fill.

14. The method of claim 1, wherein the introducing of the chlorine ($Cl_2$) gas-containing fill into the chamber body comprises:

intermixing a chlorine ($Cl_2$) gas with a nitrogen ($N_2$) gas; and providing the intermixed chlorine ($Cl_2$) gas and nitrogen ($N_2$) gas to the chamber body.

15. The method of claim 1, wherein the introducing of the chlorine ($Cl_2$) gas-containing fill into the chamber body comprises introducing chlorine ($Cl_2$) gas into the chamber body at between about 50 standard cubic centimeters per minute and about 500 standard cubic centimeters per minute while either, or both, an isolation valve and a pressure control valve coupling the chamber body to the exhaust source is closed.

16. The method of claim 1, further comprising:

providing a shaft purge to a tube member extending about a shaft member fixed to a lower wall of the chamber body, the shaft member extending through the tube member and defining a gap therebetween, the shaft member fixed in rotation relative to the substrate support arranged within the chamber body and supported for rotation within the chamber body about a rotation axis, and reducing or ceasing flow of the shaft purge.

* * * * *